United States Patent
Oh et al.

(10) Patent No.: US 11,107,521 B2
(45) Date of Patent: Aug. 31, 2021

(54) SEMICONDUCTOR MEMORY DEVICE WITH CACHE LATCHES

(71) Applicant: SK hynix Inc., Icheon-si (KR)

(72) Inventors: Sung Lae Oh, Cheongju-si (KR); Dong Hyuk Kim, Seoul (KR); Tae Sung Park, Icheon-si (KR); Soo Nam Jung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/784,837

(22) Filed: Feb. 7, 2020

(65) Prior Publication Data
US 2021/0057019 A1 Feb. 25, 2021

(30) Foreign Application Priority Data

Aug. 19, 2019 (KR) .......................... 10-2019-0100858

(51) Int. Cl.
| | | |
|---|---|---|
| *G11C 7/10* | (2006.01) | |
| *G11C 11/4094* | (2006.01) | |
| *G11C 29/00* | (2006.01) | |
| *G11C 5/02* | (2006.01) | |
| *G11C 29/02* | (2006.01) | |
| *G11C 29/44* | (2006.01) | |
| *G11C 11/4093* | (2006.01) | |

(52) U.S. Cl.
CPC .......... *G11C 11/4094* (2013.01); *G11C 5/02* (2013.01); *G11C 7/1039* (2013.01); *G11C 11/4093* (2013.01); *G11C 29/024* (2013.01); *G11C 29/44* (2013.01); *G11C 29/789* (2013.01)

(58) Field of Classification Search
CPC . G11C 11/4094; G11C 7/1039; G11C 29/789; G11C 5/02; G11C 29/024; G11C 29/44; G11C 11/4093
USPC ...................................................... 365/189.05
See application file for complete search history.

(56) References Cited

U.S. PATENT DOCUMENTS

| | | | | |
|---|---|---|---|---|
| 5,895,487 A | * | 4/1999 | Boyd ................... | G06F 12/0897 |
| | | | | 711/122 |
| 8,463,996 B2 | * | 6/2013 | Olukotun ............ | G06F 12/0842 |
| | | | | 711/118 |
| 8,625,355 B2 | * | 1/2014 | Chokan .............. | G11C 16/0483 |
| | | | | 365/185.22 |
| 9,965,388 B2 | * | 5/2018 | Chun ..................... | G11C 16/10 |
| 2017/0337130 A1 | * | 11/2017 | Chun ..................... | G11C 7/106 |

FOREIGN PATENT DOCUMENTS

| KR | 10-2016-0146287 A | 12/2016 |
|---|---|---|
| KR | 10-2017-0130969 A | 11/2017 |

* cited by examiner

*Primary Examiner* — Tha-O H Bui

(57) ABSTRACT

A semiconductor memory device may include a memory cell array; and a cache latch circuit that exchanges data with the memory cell array through a plurality of bit lines extended in a second direction crossing a first direction. The memory cell array may include a plurality of cache latches arranged in a plurality of columns in the first direction and in a plurality of rows in the second direction. Each of the cache latches may be coupled to any one of a plurality of input/output (IO) pins. Cache latches coupled to the IO pins at the same time may constitute one IO cache latch unit. The cache latches included in the one IO cache latch unit may be arranged in 2×2 array units.

20 Claims, 18 Drawing Sheets

SEMICONDUCTOR MEMORY DEVICE WITH CACHE LATCHES

CROSS-REFERENCE IO RELATED APPLICATION

The present application claims priority under 35 U.S.C. § 119(a) to Korean Patent Application No. 10-2019-0100858 filed in the Korean Intellectual Property Office on Aug. 19, 2019, which is incorporated herein by reference in its entirety.

BACKGROUND

1. Field

Exemplary embodiments relate to a semiconductor memory device, and more particularly, to a semiconductor memory device with page buffers.

2. Discussion of the Related Art

A volatile memory device may write and read data at high speed, but lose data stored therein when power supply is removed. A nonvolatile memory device may write and read data at relatively low speed, but retain data stored therein even though power supply is removed. Thus, in order to store data which needs to be retained regardless of whether power is supplied, the nonvolatile memory device is used. Examples of nonvolatile memory devices include a ROM (Read Only Memory), MROM (Mask ROM), PROM (Programmable ROM), EPROM (Erasable Programmable ROM), EEPROM (Electrically Erasable Programmable ROM), flash memory, PRAM (Phase change Random Access Memory), MRAM (Magnetic RAM), RRAM (Resistive RAM), FRAM (Ferroelectric RAM) and the like. Flash memory may be divided into NOR flash memory and NAND flash memory.

The NAND flash memory device is widely used as a data storage device. The NAND flash memory device may perform an operation required for reading and outputting data stored in memory cells, using a plurality of page buffers.

SUMMARY

In an embodiment, a semiconductor memory device may include: a memory cell array; and a cache latch circuit configured to exchange data with the memory cell array through a plurality of bit lines extending in a second direction crossing a first direction. The cache latch circuit may comprise a plurality of cache latches arranged in a plurality of columns in the first direction and in a plurality of rows in the second direction. Each of the plurality of cache latches may be coupled to any one of a plurality of input/output (IO) pins. Cache latches coupled to the IO pins at the same time may constitute one IO cache latch unit. The cache latches included in the one IO cache latch unit may be arranged in 2×2 array units.

In an embodiment, a semiconductor memory device may include: a memory cell array; a plurality of bit lines extending in a second direction crossing a first direction, and comprising a plurality of even bit lines and a plurality of odd bit lines, that are alternately arranged in the first direction; and a cache latch circuit configured to exchange data with the memory cell array through the plurality of bit lines, and comprising a plurality of cache latches arranged in a plurality of columns in the first direction and in a plurality of rows in the second direction. The cache latches may be coupled to any one of $2^N$ IO pins. The N is a positive integer. $2^N$ cache latches which are coupled to the even bit lines and coupled to the $2^N$ IO pins at the same time may constitute one first IO cache latch unit, $2^N$ cache latches which are coupled to the odd bit lines and coupled to the $2^N$ IO pins at the same time may constitute one second IO cache latch unit. The one first IO cache latch unit and the one second IO cache latch unit may comprise one cache latch unit. The cache latches included in each of the first and second IO cache latch units may be arranged in 2×2 array units.

In an embodiment, a semiconductor memory device may include: a plurality of cache latches arranged in a plurality of sections defined in a second direction crossing a first direction, and configured to form a plurality of columns and a plurality of rows in the first and second directions; a plurality of sensing latches coupled to the respective cache latches, and arranged in a plurality of regions located on both sides of each of the sections in the second direction; and a plurality of bit line select transistors arranged in the plurality of regions and coupled between the sensing latches and a plurality of bit lines expending in the second direction. Each of the cache latches may be coupled to any one of a plurality of IO pins. Cache latches coupled to the IO pins at the same time may constitute one IO cache latch unit. The cache latches included in the one IO cache latch unit may comprise a plurality of 2×2 arrays, and the cache latches comprising one of the 2×2 arrays are arranged in the same section.

DETAILED DESCRIPTION

Figure 1:
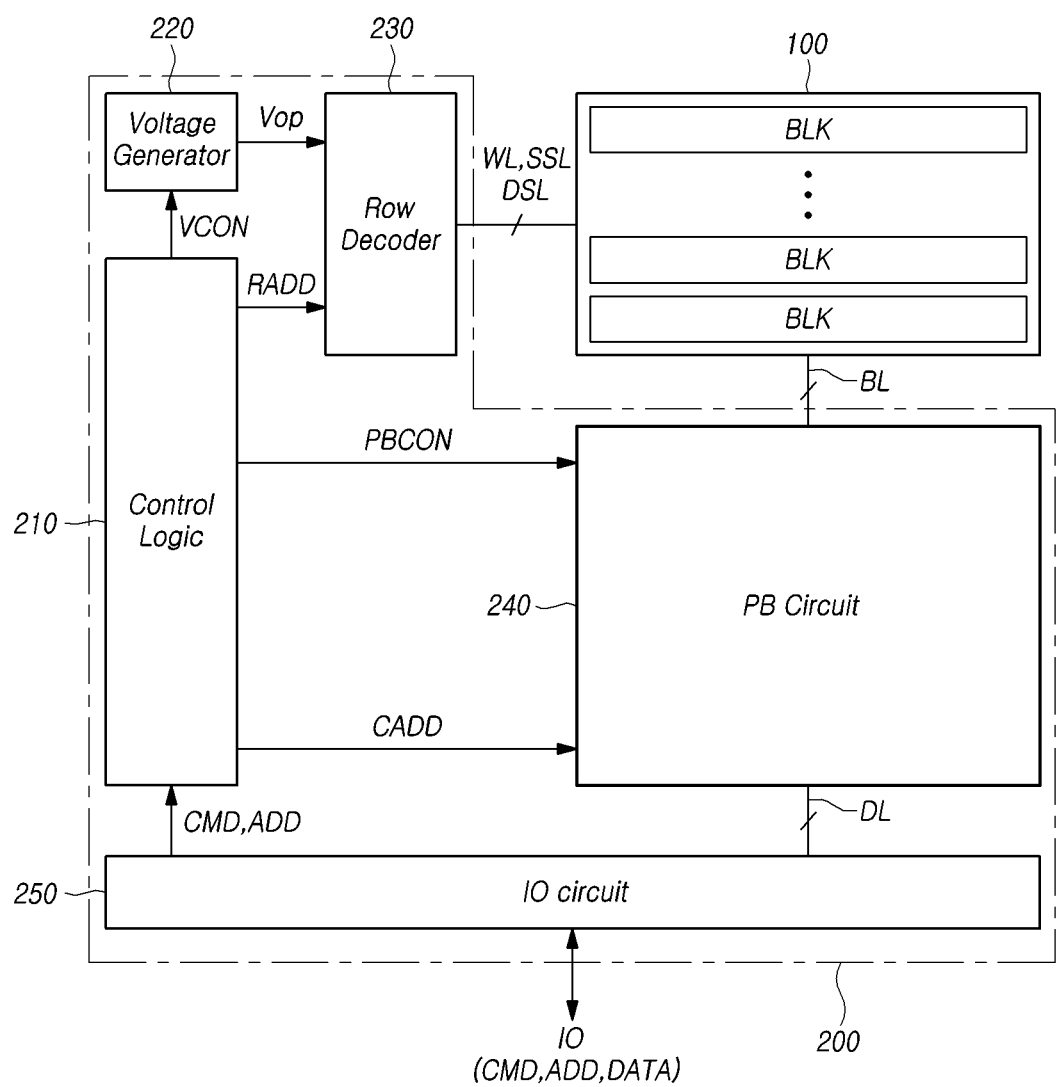
FIG. 1 is a block diagram illustrating a memory device in accordance with an embodiment of the disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the), the article may include a plural of that noun unless specifically stated otherwise.

In embodiments of the disclosure should be interpreted as including error margins even in the absence of explicit statements.

Also, in describing the elements of the disclosure, there may be terms used like first, second, A, B, (a), and (b). These are solely for the purpose of differentiating one element from the other and do not to imply or suggest the substances, order, sequence or number of the elements. Also, elements in embodiments of the disclosure are not limited by these terms. These terms are used to merely distinguish one element from another. Accordingly, as used herein, a first element may be a second element within the technical spirit of the disclosure.

If an element is described as "connected," "coupled" or "linked" to another element, the element may be directly "connected," "coupled" or "linked," but still another element is interposed therebetween or the respective elements may be indirectly "connected," "coupled" or "linked" via a third element. In describing positional relationship, such as "an element A on an element B," "an element A above an element B," "an element A below an element B" and "an element A next to an element B," another element C may be disposed between the elements A and B unless the term "directly" or "immediately" is explicitly used. When a positional relationship is described, for example, when a positional relationship between two elements, such as 'on', 'over', 'under' or 'beside' is described, one or more other elements may be located between two elements, as long as a term such as 'directly' or 'immediately' is not used.

Also, features of various exemplary embodiments of the disclosure may be coupled, combined or separated partially or totally. Technically various interactions and operations are possible. Various exemplary embodiments can be carried out individually or in combination.

Hereinafter, embodiments of the disclosure will be described in detail with reference to the accompanying drawings.

FIG. 1 is a block diagram illustrating a memory device in accordance with an embodiment of the disclosure.

Referring to FIG. 1, the semiconductor memory device in accordance with the present embodiment may include a memory cell array 100 and a peripheral circuit 200. The peripheral circuit 200 may include a control logic 210, a voltage generator 220, a row decoder 230, a page buffer (PB) circuit 240 and an input/output (IO) circuit 250.

The memory cell array 100 may include a plurality of memory blocks BLK. Although not illustrated, each of the memory blocks BLK may include a plurality of cell strings. Each of the cell strings may include one or more drain select transistors, a plurality of memory cells and one or more source select transistors all coupled together in series. The memory cells may be volatile memory cells or nonvolatile memory cells.

The memory cell array 100 may be coupled to the row decoder 230 through word lines WL and select lines DSL and SSL. The select lines DSL and SSL may include a drain select line DSL and a source select line SSL. The memory cell array 100 may be coupled to the PB circuit 240 through bit lines BL. The memory cell array 100 may store data received through the PB circuit 240 during a program operation, and transmit data stored therein to the PB circuit 240 during a read operation.

The control logic 210 may output a page buffer control signal PBCON for controlling the PB circuit 240 in response to a command CMD inputted through the IO circuit 250. The control logic 210 may output a voltage control signal VCON for generating a voltage required for the semiconductor memory device in response to the command CMD inputted through the IO circuit 250. The control logic 210 may output a row address signal RADD and a column address signal CADD in response to an address signal ADD inputted through the IO circuit 250.

The voltage generator 220 may generate various operation voltages Vop used for a program, read or erase operation in response to the voltage control signal VCON of the control logic 210. For example, the operation voltages Vop may include a program voltage, a pass voltage, a read voltage and an erase voltage.

The row decoder 230 may select one of the memory blocks BLK of the memory cell array 100 in response to the row address signal RADD from the control logic 210. The row decoder 230 may transfer the operation voltage Vop from the voltage generator 220 to the word lines WL and the select lines DSL and SSL coupled to the selected memory block BLK.

The PB circuit 240 may receive the page buffer control signal PBCON from the control logic 210, and transmit/receive a data signal DATA to/from the IO circuit 250. The PB circuit 240 may control the bit lines arranged in the memory cell array 100 in response to the page buffer control signal PBCON. For example, the PB circuit 240 may detect data stored in a memory cell of the memory cell array 100 by sensing a signal of a bit line BL of the memory cell array 100 in response to the page buffer control signal PBCON, and transmit the data signal DATA to the IO circuit 250 according to the detected data. The PB circuit 240 may apply a signal to a bit line BL based on the data signal DATA received from the IO circuit 250 in response to the page buffer control signal PBCON, and thus write data to a memory cell of the memory cell array 100. The PB circuit 240 may write data to a memory cell coupled to a word line enabled by the row decoder 230, or may read data from the memory cell.

The IO circuit 250 may transfer the command CMD or address ADD inputted from the outside to the control logic 210, or exchange data with the PB circuit 240 through data lines DL. The IO circuit 250 may include a plurality of IO sense amplifiers configured to generate data by amplifying voltages of the data lines DL, and may output the generated data to an IO path IO. The IO path IO may include $2^N$ data IO pins where N is a natural number equal to or more than 2. Typically, N is 3 (N=3). In this case, the IO path IO may include eight data IO pins defined as IO<0> to IO<7>.

Figure 2:
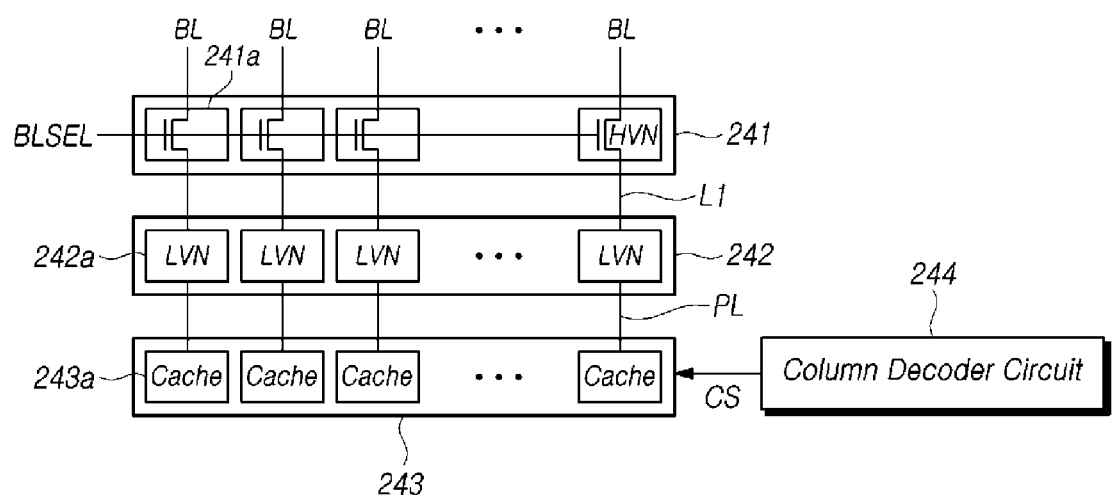
FIG. 2 is a block diagram illustrating a page buffer (PB) circuit of FIG. 1 in accordance with an embodiment of the disclosure.

FIG. 2 is a block diagram illustrating the PB circuit of FIG. 1.

Referring to FIG. 2, the page buffer circuit may include a bit line selection circuit 241, a sensing latch circuit 242, a cache latch circuit 243 and a column decoder circuit 244.

The bit line selection circuit 241 may include a plurality of bit line select transistors (HVN) 241a, each coupled to a respective bit line BL. Each of the bit line select transistors 241a may be coupled between the corresponding bit line BL and a line L1, and may operate in response to a bit line selection signal BLSEL. When the bit line selection signal BLSEL is enabled, the bit line select transistor 241a may couple the bit line BL and the line L1 to each other. When the bit line selection signal BLSEL is disabled, the bit line select transistor 241a may isolate the bit line BL and the line L1 from each other.

The sensing latch circuit 242 may include a plurality of sensing latches (LVN) 242a coupled to the bit line select transistors 241a through the lines L1, respectively. Each of the sensing latches 242a may apply a voltage to the line L1 based on data stored therein. The voltage applied to the line L1 may be transferred to the bit line BL through the bit line select transistor 241a. The sensing latch 242a may perform latching based on the voltage of the line L1. The sensing latch 242a may perform latching based on the voltage transferred to the line L1 through the bit line select transistor 241a from the bit line BL.

The cache latch circuit 243 may include a plurality of cache latches 243a coupled to the sensing latches 242a through page lines PL, respectively. Each of the cache latches 243a may exchange data with the corresponding sensing latch 242a through the page line PL. The cache latch 243a may exchange data with the IO circuit 250 of FIG. 1 through the data line DL of FIG. 1. The cache latch 243a may store data received from the sensing latch 242a, and transfer data stored therein to the IO circuit 250 through the data line in response to a column selection signal CS inputted from the column decoder circuit 244. The cache latch circuit 243 may exchange data with the sensing latch circuit 242 or the IO circuit 250 in response to the page buffer control signal PBCON received from the control logic 210 of FIG. 1.

The column decoder circuit 244 may generate the column selection signal CS in response to the column address signal CADD inputted from the control logic 210 of FIG. 1. For example, when eight data IO pins are used, eight cache latches 243a may be selected from among the cache latches 243a of the cache latch circuit 243 in response to the column select signal CS, and data stored in the selected eight cache latches 243a may be transmitted to the IO circuit through the data lines DL.

Hereafter, the arrangement direction of the bit lines in the accompanying drawings will be defined as a first direction FD, and the extension direction of the bit lines will be defined as a second direction SD. The first direction FD and the second direction SD may be substantially cross each other at substantially right angles. A third direction TD may correspond to a direction vertical to the first and second directions FD and SD. In the following descriptions of this specification, 'vertical' or 'vertical direction' will be used as substantially the same meaning as the third direction TD. In the drawings, a direction indicated by an arrow and the opposite direction thereof represent the same direction.

Figure 3:
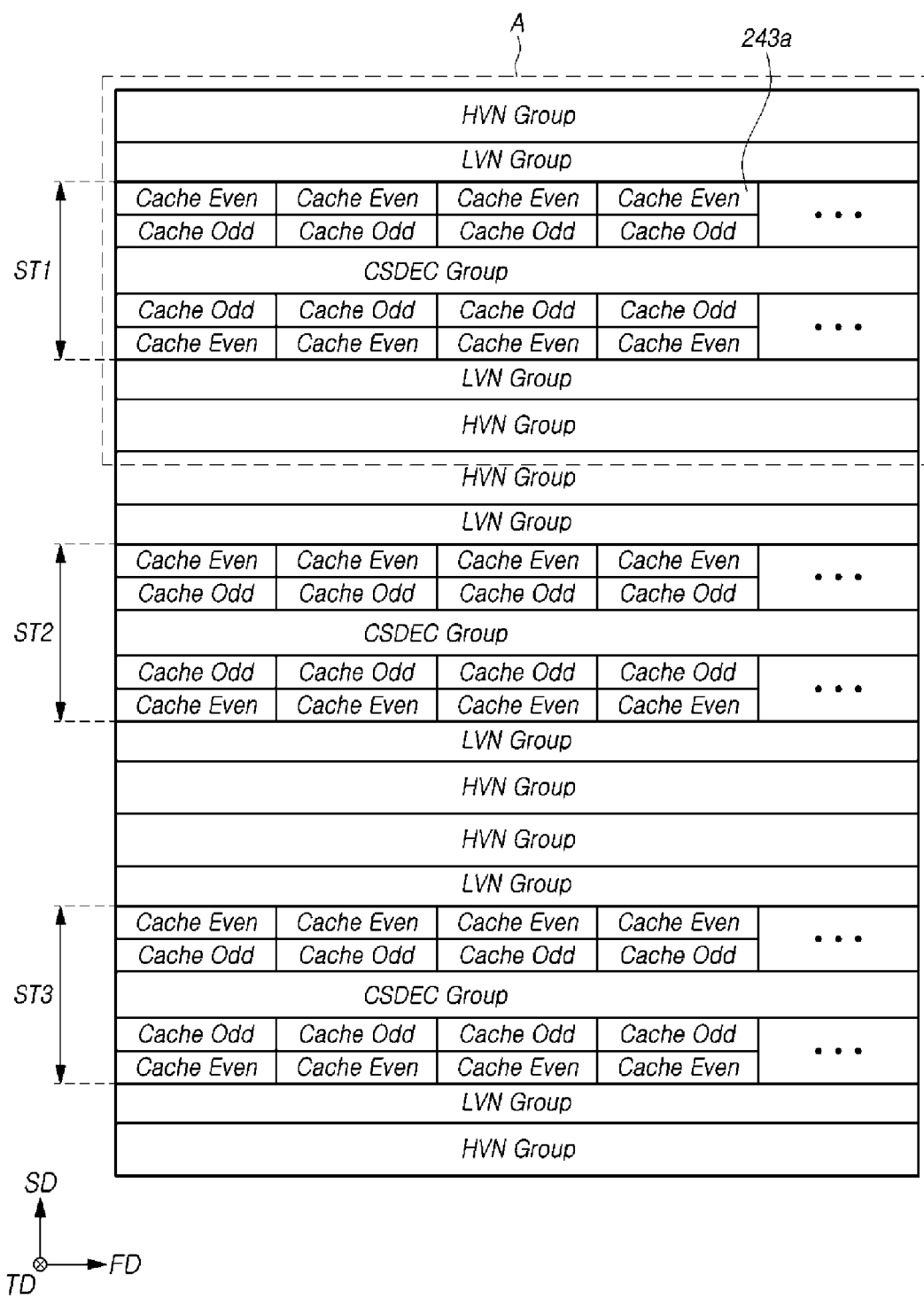
FIG. 3 is a plan view illustrating a schematic layout of the PB circuit in accordance with an embodiment of the disclosure.
Figure 4:
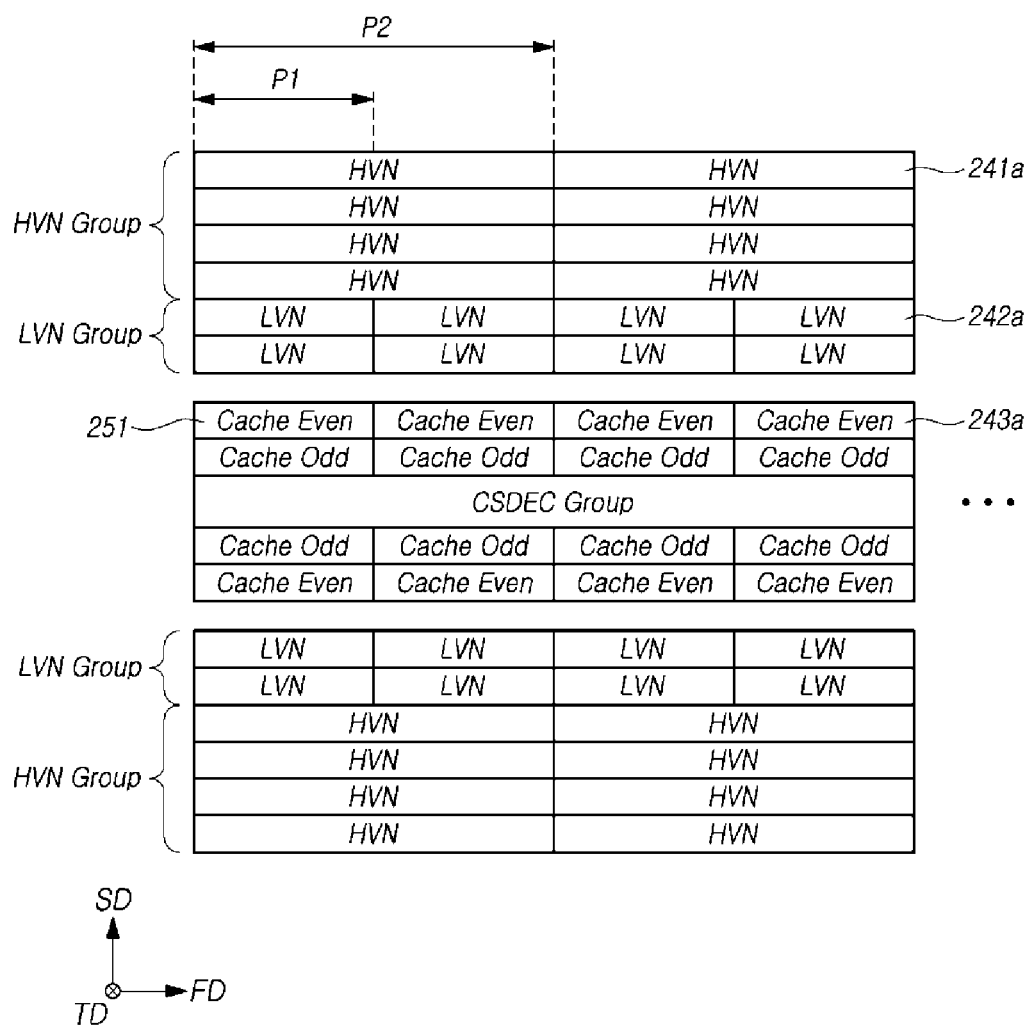
FIG. 4 is a plan view illustrating a portion A of FIG. 3 in accordance with an embodiment of the disclosure.

FIG. 3 is a plan view illustrating a schematic layout of a PB circuit in accordance with an embodiment of the disclosure, and FIG. 4 is a plan view illustrating a portion A of FIG. 3 in more detail.

Referring to FIG. 3, a plurality of sections ST1 to ST3 may be defined in the second direction SD. In each of the sections ST1 to ST3, a plurality of cache latches 243a and one column decoder group CSDEC Group may be arranged.

In each of the sections ST1 to ST3, the cache latches 243a may be arranged in four rows in the second direction SD, with each row aligned in the first direction FD. Each of the cache latches 243a may be coupled to an even bit line or odd bit line. Within each of the sections ST1 to ST3, two rows of cache latches 243a are coupled to the even bit lines, and the other two rows of cache latches 243a are coupled to the odd bit lines. In the drawings, Cache Even represents a cache latch coupled to an even bit line, and Cache Odd represents a cache latch coupled to an odd bit line.

The column decoder group CSDEC Group may include a plurality of column decoders (not illustrated). The column decoders may be coupled to the cache latches 243a arranged in the same section (i.e., one of the sections ST1 to ST3) as the column decoders, and provide the column select signal to the cache latches 243a.

In the second direction SD, three sections ST1 to ST3 may be provided. In this case, the cache latches 243a may be arranged in four rows for each of the sections ST1 to ST3, i.e. a total of twelve (12) rows. The cache latch circuit that includes the cache latches 243a arranged in the twelve rows may be described as including twelve stages. The number of the stages of the cache latch circuit may be defined by the number of the cache latches 243a arranged in the column direction, i.e. the second direction SD corresponding to the extension direction of the bit lines.

On either side of each of the sections ST1 to ST3 in the second direction SD, one sensing latch group LVN Group and one bit line selection group HVN Group may be arranged. The sensing latch group LVN Group may be disposed closer to the corresponding ST section (e.g., one of the sections ST1 to ST3) than the bit line selection group HVN Group. The sensing latch group LVN Group may be disposed between the ST section and the bit line selection group HVN Group. The sensing latch groups on either side of an ST section may be described as a pair of sensing latch groups LVN Group. The bit line selection groups on either side of the same ST section may be described as a pair of bit line selection groups HVN group.

Referring to FIG. 4, each of the sensing latch groups LVN Group may include a plurality of sensing latches 242a. The pair of sensing latch groups LVN Group may be coupled to the cache latches 243a located in a respective ST section through the page lines, respectively.

Each of the bit line selection groups HVN group may include a plurality of bit line select transistors 241a. The pair of bit line selection groups HVN Group may be coupled to the sensing latches 242a arranged in a respective ST section through the lines, respectively.

During an erase operation, an erase voltage may be applied to a bit line and transferred to the bit line select transistor 241a through the bit line. The erase voltage applied to the bit line during the erase operation may be interrupted by the bit line select transistor 241a so as not to be transferred to the sensing latch 242a. For this reason, the bit line select transistor 241a may be configured as a high-voltage element capable of withstanding a high voltage, and the sensing latch 242a may be configured as a low-voltage element.

The sensing latch 242a may have a first size P1 as a pitch in the first direction FD. The first size P1 may be substantially equal to the pitch of the cache latch 243a in the first direction FD. The number of the sensing latches 242a arranged in the first direction FD may be substantially equal to the number of the cache latches 243a arranged in the first direction FD. In each of the sensing latch groups LVN Group, the sensing latches 242a may be arranged in two rows.

The bit line select transistor 241a may have a second size P2 as a pitch in the first direction FD. The second size P2 may be larger than the pitch P1 of the cache latch 243a in the first direction FD. The number of the bit line select transistors 241a arranged in the first direction FD may be smaller than the number of the cache latches 243a arranged in the first direction FD. For example, the pitch P2 of the bit line select transistors 241a in the first direction FD may be twice as large as the pitch P1 of the cache latches 243a in the first direction FD. Thus, the number of the bit line select transistors 241a arranged in the first direction FD may be half of the number of the cache latches 243a arranged in the first direction FD. In each of the bit line selection groups HVN Group, the bit line select transistors 241a may be arranged in four rows.

Figure 5:
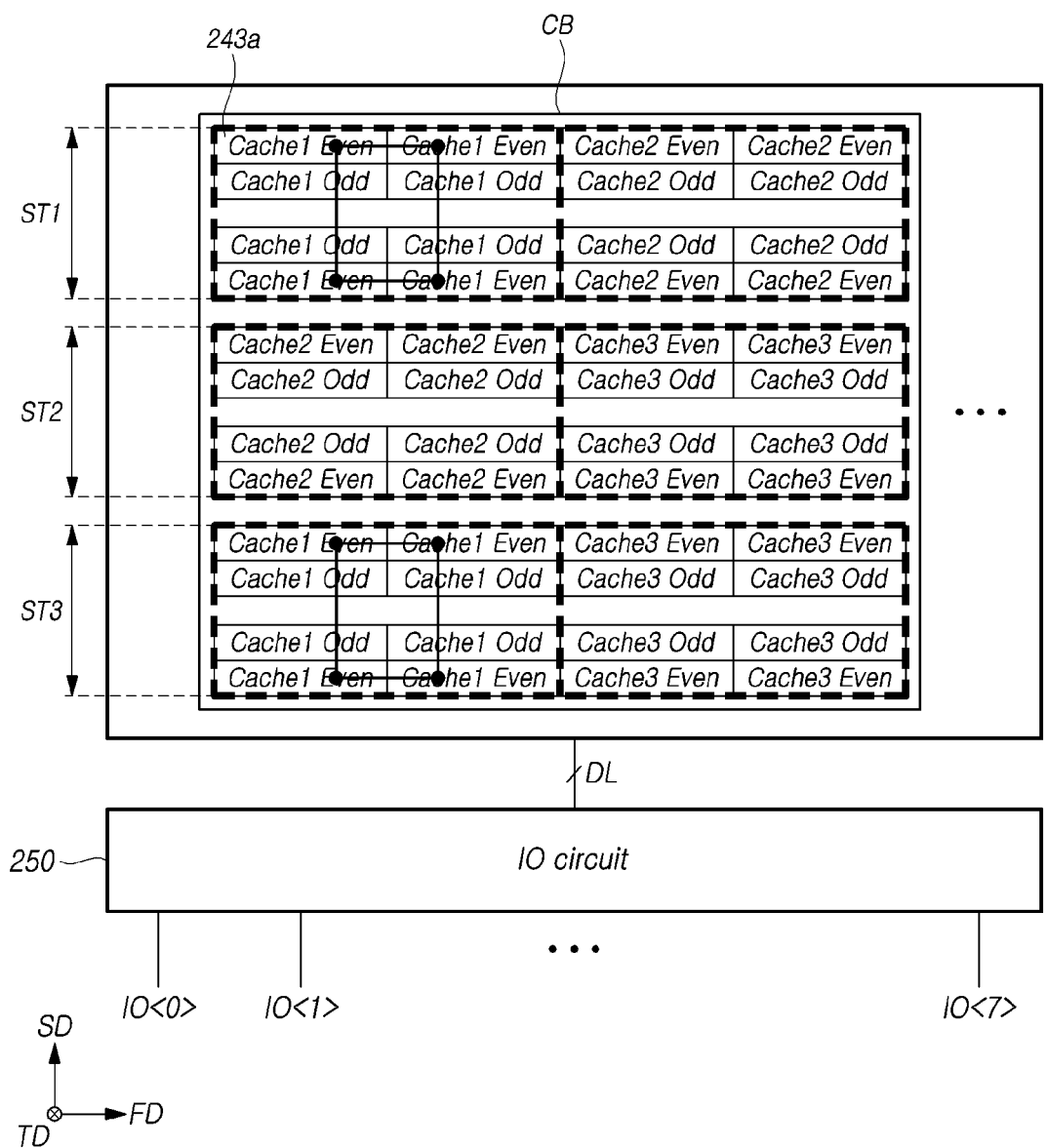
FIG. 5 is a diagram for describing input/output (IO) path allocation and column selection coding of cache latches in a semiconductor memory device in accordance with an embodiment of the disclosure.

FIG. 5 is a diagram for describing IO path allocation and column selection coding of the cache latches in the semiconductor memory device in accordance with an embodiment of the disclosure.

Referring to FIG. 5, the cache latches 243a constituting the cache latch circuit may be arranged in 12 rows in the second direction SD. When the cache latches 243a are arranged in 12 rows in the second direction SD, unit cache blocks CB each including 48 cache latches 243a may be repeatedly arranged in the first direction FD. In this specification, the number of the rows in which the cache latches 243a are arranged and the number of the cache latches 243a included in the unit cache block CB are only examples for promoting understanding, and embodiments contemplated by this disclosure are not limited to the numbers and quantities used for illustration in this specification.

The IO path may include eight IO pins IO<0> to IO<7>. Each of the cache latches 243a may be coupled to one of the IO pins IO<0> to IO<7> through the IO circuit 250. The cache latches 243a that are simultaneously coupled to the IO pins IO<0> to IO<7> may constitute one IO cache latch unit.

FIG. 5 illustrates the cache latches 243a included in an IO cache latch unit. Under the supposition that an even cache latch coupled to an even bit line is represented by 'Cache # Even', even cache latches with the same number # may be included in the same IO cache latch unit. Even cache latches with different numbers # may be included in a different IO cache latch unit. Similarly, under the supposition that an odd cache latch coupled to an odd bit line is represented by 'Cache # Odd', odd cache latches with the same number # may be included in the same IO cache latch unit, while odd cache latches with different numbers # may be included in a different IO cache latch unit.

For example, eight cache latches 243a (e.g., eight Cache 1 Even latches) included in one IO cache latch unit may be selected at the same time by a column select signal. Therefore, data stored in the eight cache latches 243a included in one IO cache latch unit may be outputted in parallel through the IO pins IO<0> to IO<7>. The IO cache latch unit may correspond to a data IO unit.

The even cache latches Cache # Even having the same number # (e.g., Cache2 Even) and the odd cache latches Cache # Odd having the same number # (e.g., Cache2 Odd) may constitute one cache latch unit. The cache latch unit may correspond to an unit of column repair. The eight even cache latches Cache # Even within one cache latch unit may constitute a first IO cache latch unit. The eight odd cache latches Cache # Odd within one cache latch unit may constitute a second IO cache latch unit. One cache latch unit may include two IO cache latch units.

The cache latches 243a included in one cache latch unit may be arranged in a plurality of 4×2 arrays. When one cache latch unit includes 16 cache latches 243a, the 16 cache latches 243a may be arranged in two 4×2 arrays. In FIG. 5, boxes indicated by thick dotted lines represent 4×2 arrays, respectively. The cache latches 243a included in one cache latch unit may be arranged in two separate 4×2 array units. The cache latches 243a constituting one of the 4×2 arrays of the cache latch unit, i.e. a box indicated by a thick dotted line in FIG. 5, may be arranged in two consecutive columns in the first direction FD and four consecutive rows in the second direction SD.

The cache latches 243a constituting one of the 4×2 arrays of the cache latch unit, i.e. a box indicated by a thick dotted line in FIG. 5, may be arranged in the same section (one of the sections ST1 to ST3). The number of rows in which the cache latches 243a included in one cache latch unit are arranged may be smaller than the number of rows in which the entire cache latches 243a included in the cache latch circuit are arranged. For example, the number of rows in which all cache latches 243a included in the cache latch circuit are arranged may be 12, while the number of rows in which the cache latches 243a with the number Cache # of 1 (e.g., the cache latches 243a in one cache latch unit) are arranged may be eight.

The cache latches 243a constituting one of the 4×2 arrays of the cache latch unit, i.e. a box indicated by a thick dotted line in FIG. 5, may include four even cache latches and four odd cache latches. The four even cache latches included in one of the 4×2 arrays of the cache latch unit, i.e. a box indicated by a thick dotted line of FIG. 5, may be included in one IO cache latch unit, and may be arranged in a 2×2 array. The four odd cache latches included in one of the 4×2 arrays of the cache latch unit, i.e. a box indicated by a thick dotted line of FIG. 5, may be included in one IO cache latch unit, and arranged in a 2×2 array.

The cache latches 243a included in one IO cache latch unit may be arranged in two 2×2 arrays. For example, eight even cache latches Cache1 Even with the number # of 1, indicated by the bold rectangle with a dot at each corner, may be arranged in two 2×2 arrays. That is, the cache latches 243a included in one IO cache latch unit may be arranged in 2×2 array units. The cache latches 243a constituting one of the 2×2 arrays of the IO cache latch unit may be arranged in two consecutive columns in the first direction FD. The cache latches 243a constituting one of the 2×2 arrays of the IO cache latch unit may not be arranged in consecutive rows in the second direction SD.

The cache latches 243a constituting one of the 2×2 arrays of the IO cache latch unit may be arranged in one section of the sections ST1 to ST3. The two 2×2 arrays included in one IO cache latch unit may be arranged in different sections. For example, one of the two 2×2 arrays composed of the eight even cache latches Cache1 Even with the number # of 1, indicated by the bold rectangle with a dot at each corner, may be disposed in the first section ST1, and the other one of the two 2×2 arrays may be disposed in the third section ST3.

Figure 6:
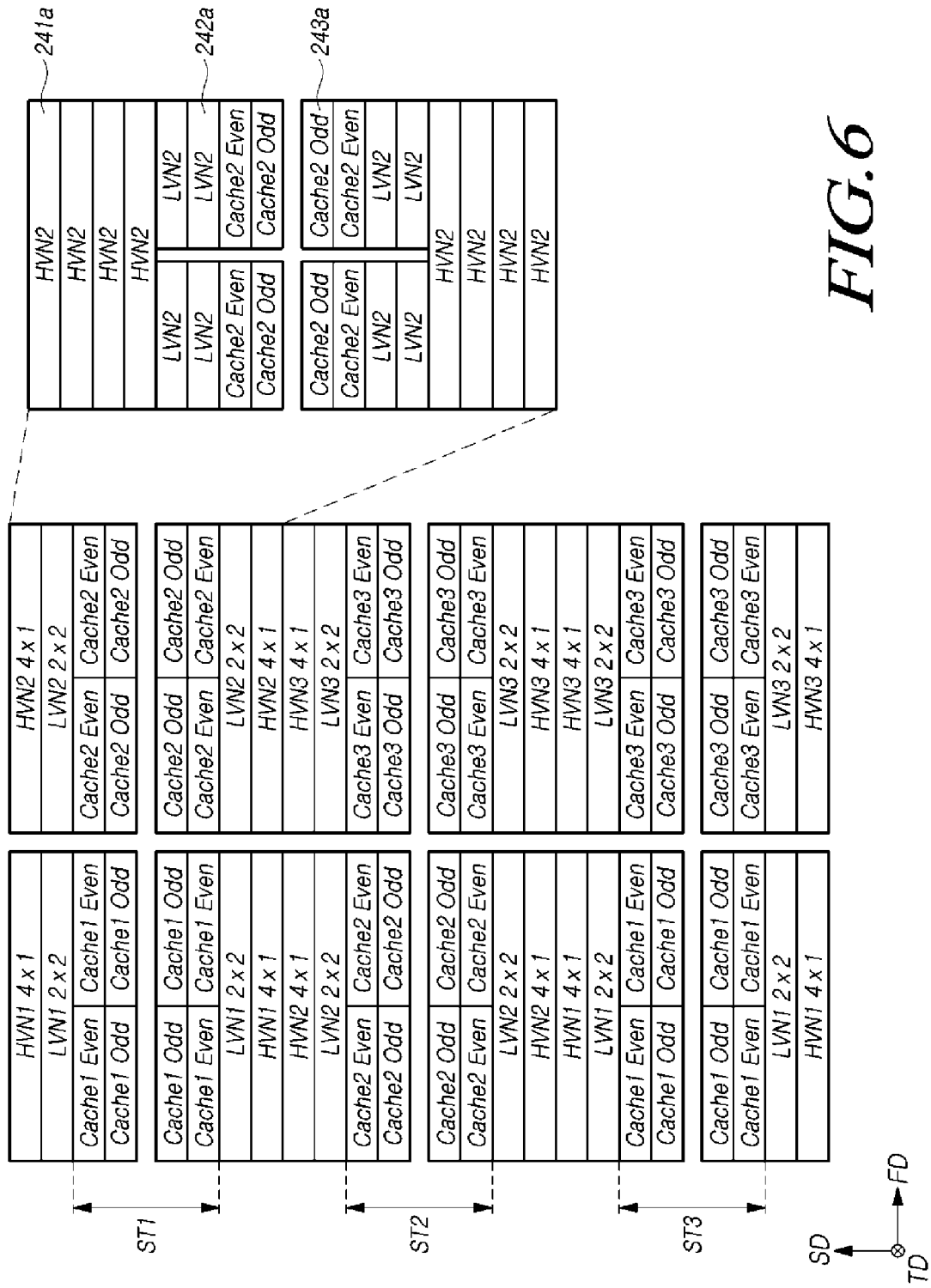
FIG. 6 is a diagram for describing column selection coding of sensing latches and bit line select transistors in accordance with an embodiment of the disclosure.

FIG. 6 is a diagram for describing column selection coding of the sensing latches and the bit line select transistors in accordance with an embodiment of the disclosure.

Referring to FIG. 6, the cache latches 243a may be arranged in four rows in each of the sections ST1 to ST3. On either side of an ST section (e.g., one of the sections ST1 to ST3), two rows of the sensing latches 242a and four rows of the bit line select transistors 241a may be arranged. FIG. 6 illustrates the cache latch unit coupled to the sensing latches 242a and to the bit line select transistors 241a. Under the supposition that each of the sensing latches 242a is represented by 'LVN #', the sensing latches 242a with the same number # may be coupled to the same cache latch unit, and the sensing latches 242a with different numbers # may be coupled to different cache latch units. The sensing latches 242a with the same number # may constitute one sensing latch unit.

In order to simplify the structure of the page lines for coupling the sensing latches 242a and the cache latches 243a, the sensing latches 242a and the cache latches 243a which are coupled to each other may be arranged in a line in the second direction SD. Thus, the layout of the sensing latch 242a may be decided by the layout of the cache latches 243a. An expanded portion on the right side of FIG. 6 illustrates a layout of the cache latches 243a and the sensing latches 242a coupled to the cache latches 243a. As illustrated in FIG. 6, eight sensing latches 242a coupled to the 4×2 array of the cache latches 243a may be separated into two groups in 2×2 array units, each arranged on opposite sides of the 4×2 array of the cache latches 243a in the second direction SD.

The bit line select transistors 241a may be coupled to the cache latches 243a through the sensing latches 242a. FIG. 6 illustrates the bit line select transistors 241a coupled to a cache latch unit. Under the supposition that each of the bit line select transistors 241a is represented by 'HVN #', the bit line select transistors 241a with the same number # may be coupled to the same cache latch unit, and the bit line select transistors 241a with different numbers # may be coupled to different cache latch units. The bit line select transistors 241a with the same number # may constitute one bit line selection unit. The bit line selection unit may correspond to an unit of column repair.

In order to simplify the structure of the lines for coupling the bit line select transistors 241a and the sensing latches 242a, the bit line select transistors 241a and the sensing latches 242a which are coupled to each other may be arranged in a line in the second direction SD. Thus, the layout of the bit line select transistors 241a may be decided according to the layout of the sensing latches 242a constituting the sensing latch unit. The expanded portion on the right side of FIG. 6 illustrates the layout of the cache latches 243a and the bit line select transistors 241a coupled to the cache latches 243a. As illustrated in FIG. 6, eight bit line select transistors 241a coupled to the 4×2 array of the cache latches 243a may be separated into two groups in 4×1 array units, and arranged on both sides of the 4×2 array of the cache latches 243a in the second direction SD.

Figure 7:
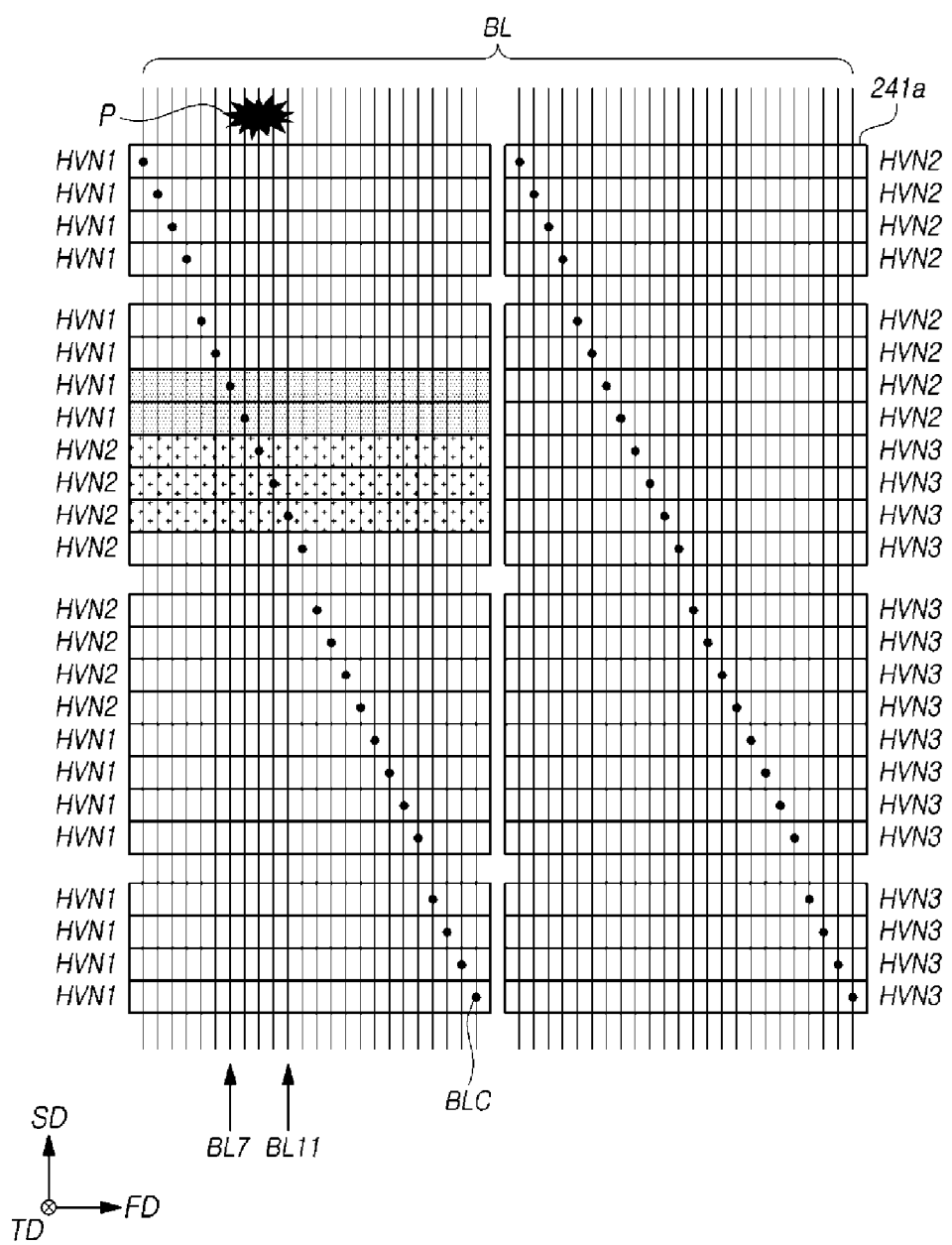
FIG. 7 is a diagram illustrating an example of a layout of bit line contacts coupled to bit line select transistors in accordance with an embodiment of the disclosure.

FIG. 7 is a diagram illustrating an example of a layout of bit line contacts coupled to bit line select transistors.

Referring to FIG. 7, the bit line select transistors 241a may be coupled to the bit lines BL through bit line contacts BLC, respectively. The bit line contacts BLC may be arranged in a diagonal shape within a column unit of bit line select transistors 241a. For example, in the respective columns of the bit line select transistors 241a, the bit line contacts BLC may be arranged at positions moving away in the second direction SD as the positions of the bit line select transistors 241a are moved downward in the first direction FD. Such a layout of the bit line contacts BLC may be defined as a column-based single-direction diagonal layout.

According to the column-based single-direction diagonal layout of the bit line contacts BLC, the bit line contacts BLC in the same row may be arranged so as not to be adjacent to each other. With the increase in degree of integration of memory devices, the space between the bit lines BL has been gradually reduced. In such a situation, when the bit line contacts BLC are arranged adjacent to each other in the same row, a defect is highly likely to occur. For example, the bit line contacts BLC may be shorted to each other. When the bit line contacts BLC are arranged in the column-based single-direction diagonal layout as illustrated in FIG. 7, it is possible to reduce defects in which the bit line contacts BLC are shorted to each other. For reference, FIG. 7 illustrates that the length of the bit line select transistors 241a in the first direction FD is larger than that in the second direction SD, but the lengths illustrated in FIG. 7 are not drawn to scale. In reality, the length of the bit line select transistors 241a in the first direction FD may be equal to or smaller than the width of the bit line select transistors 241a in the second direction SD.

Referring to FIGS. 6 and 7, the cache latches 243a included in one cache latch unit are arranged in 4×2 array units, and the bit line select transistors 241a included in one bit line selection unit are arranged in 4×1 array units relative to the layout of the cache latches 243a. Thus, the bit line select transistors 241a included in one bit line selection unit, i.e. the bit line select transistors 241a (HVN #) having the same number #, may not be consecutively arranged in the column direction. Therefore, when the bit line contacts BLC are arranged in the column-based single-direction diagonal layout, bit lines coupled to 16 bit line select transistors 241a included in one bit line selection unit are not necessarily consecutively arranged in the second direction.

In the memory device, a process defect may occur in a specific bit line is produced with a defective particle P a fabrication process or the like. In this case, when a read operation is performed, wrong data may be transmitted to a cache latch, and thus cause a read error. Therefore, in order to prevent such a read error, cache latches for repairing a cache latch in which defective data are loaded, i.e. cache latches for defect repair, may be included in the memory device. During a read operation, a defective cache latch in which defective data are loaded may be replaced with a cache latch for defect repair, in order to output data stored in the cache latch for defect repair without outputting the data stored in the defective cache latch. Such an operation is referred to as column repair. Furthermore, as devices continue to scale down, bit lines located close to a defective bit line may become defective. Therefore, in order to increase the defect repair efficiency, the above-described column repair may be performed on a plurality of cache latches at the same time.

During the column repair, when a defect occurs in any one of 16 bit lines coupled to one cache latch unit, the entire cache latch unit is processed as a defective cache latch unit, and the defective cache latch unit is replaced with a normal cache latch unit. When defective particles occur across bit lines coupled to two different cache latch units, the two cache latch units need to be processed as defective cache latch units, resulting in a lower defect repair efficiency. Therefore, in order to increase defect repair efficiency, the bit lines coupled to one cache latch unit, i.e. the bit lines coupled to one bit line selection unit, need to be consecutively arranged.

When the bit lines are arranged in the column-based single-direction diagonal layout, the bit lines coupled to one bit line selection unit are not consecutively arranged, resulting in a lower defect repair efficiency. As an example, the number # of 'HVN #' marked on the bit line select transistors 241a coupled to the bit lines BL<7> and BL<8> is 1, and the number # of 'HVN #' marked on the bit line select transistors 241a coupled to the bit lines BL<9> to BL<11> is 2. This indicates that the bit lines BL<7> and BL<8> and the bit lines BL<9> to BL<11> are coupled to different cache latch units. Therefore, when defective particles P occur across the bit lines BL<7> to BL<11> as illustrated in FIG. 7, two cache latch units coupled to two bit line selection units need to be processed as defective cache latch units. Thus, the defect repair efficiency may be lowered.

Figure 8:
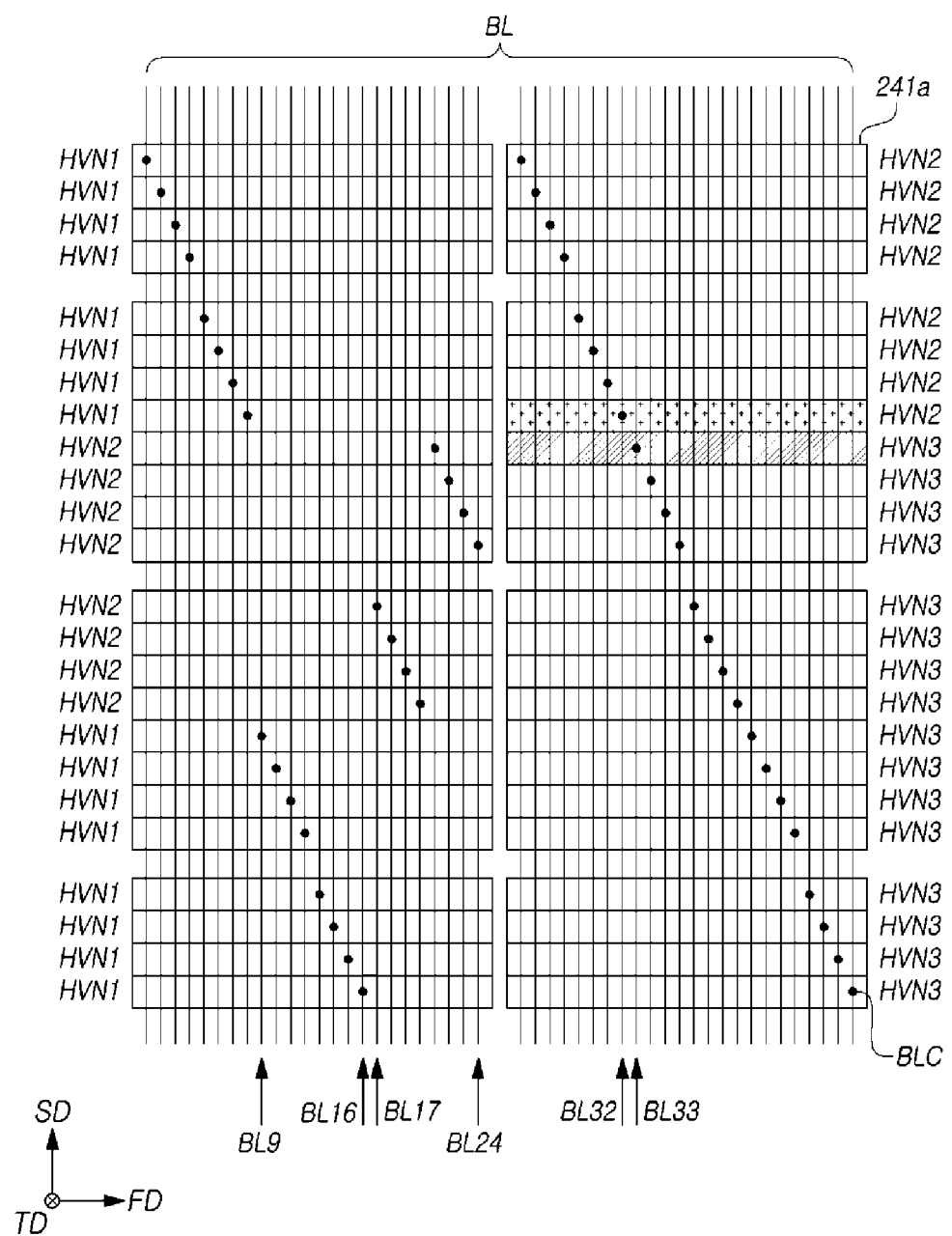
FIG. 8 is a diagram illustrating another example of a layout of the bit line contacts coupled to bit line select transistors in accordance with an embodiment of the disclosure.

FIG. 8 is a diagram illustrating another example of a layout of bit line contacts coupled to bit line select transistors.

Referring to FIG. 8, the bit line select transistors 241a are arranged in the same layout as those of FIG. 7. However, FIG. 8 is different from FIG. 7 in that the positions of the bit line contacts BLC are changed. For example, the positions of the bit line contacts BLC are changed in such a manner that the bit lines BL<9> to BL<16> are coupled to the bit line select transistors 241a of the 17th to 24th rows of the first column, respectively, and the bit lines BL<17> to BL<24> are coupled to the bit line select transistors 241a of the ninth to 16th rows of the first column, respectively. In this case, because the bit lines BL coupled to the 16 bit line select transistors 241a included in one bit line selection unit are consecutively arranged in the first direction, the efficiency of the column repair for repairing a column defect caused by a defective particle can be improved.

With the increase in the degree of integration of semiconductor memory devices, the space between bit lines has been gradually reduced. Thus, a defect in which adjacent bit line contacts BLC are shorted to each other is highly likely to occur. When bit lines to which the two bit line contacts BLC shorted to each other are coupled to one cache latch unit, the column repair may be performed only on the one cache latch unit. However, when the bit lines to which the two bit line contacts BLC shorted to each other are coupled to different cache latch units, both of the two cache latch units need to be processed as defective cache latch units. Thus, the column repair efficiency may be lowered.

For example, the number # of 'HVN #' marked on the bit line select transistor 241a coupled to the bit line BL<32> is 2, and the number # of 'HVN #' marked on the bit line select transistor 241a coupled to the bit line BL<33> is 3. That is, the numbers are different from each other. This indicates that the bit line BL<32> and the bit line BL<33> are coupled to different cache latch units. Since the bit line contact BLC coupled to the bit line BL<32> and the bit line contact BLC coupled to the bit line BL<33> are disposed adjacent to each other, the bit line contacts BLC are highly likely to be shorted to each other when a defect is present. When the bit line contact BLC coupled to the bit line BL<32> and the bit line contact BLC coupled to the bit line BL<33> are shorted to each other, both of the two cache latch units need to be processed as defective cache latch units. Thus, the column repair efficiency may be lowered.

Although the space between the bit lines BL<32> and BL<33> can be increased to increase the space between the bit line contacts BLC to improve the column repair efficiency, the size of the semiconductor memory device would also increase.

Figure 9:
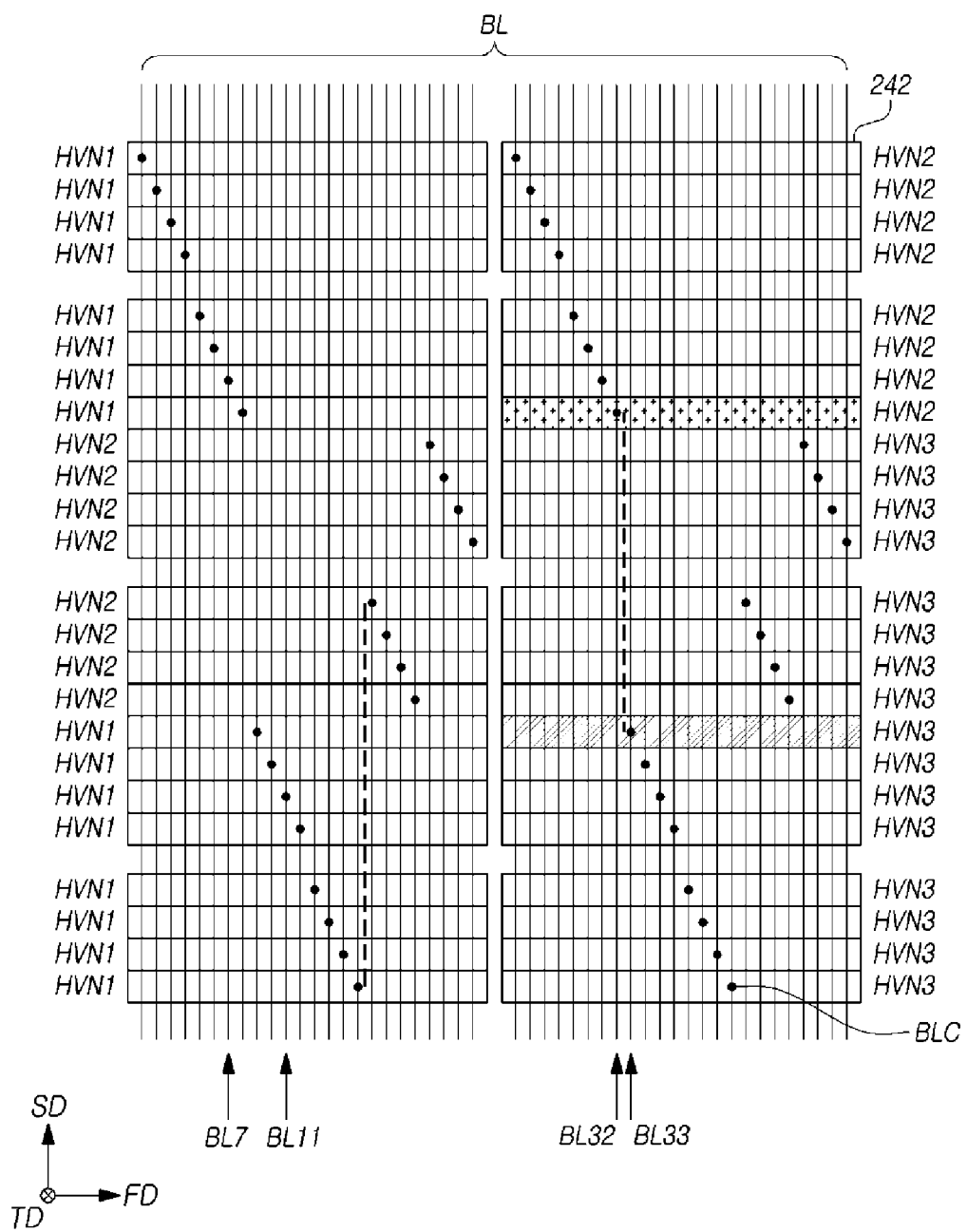
FIG. 9 is a diagram illustrating a layout of bit line contacts in accordance an embodiment of the disclosure.

FIG. 9 is a diagram illustrating a layout of bit line contacts in accordance with an embodiment of the disclosure.

Referring to FIG. 9, the bit line select transistors 241a are arranged in the same layout as those of FIG. 8, but FIG. 9 is different from FIG. 8 in that the positions of the bit line contacts BLC are changed in such a manner that two bit line contacts BLC coupled to different cache latch units, and coupled to two bit lines adjacent to each other, are separated and not adjacent to each other.

For example, the positions of the bit line contacts BLC are disposed so that the bit line BL<33> is not coupled to the bit line select transistor 241a of the ninth row of the second column, but coupled to the bit line select transistor 241a of the 17th row of the second column. In this case, the space between the bit line contact BLC coupled to the bit line BL<32> and the bit line contact BLC coupled to the bit line BL<33> can be increased without increasing the space between the bit lines BL<32> and BL<33>. Therefore, the column repair efficiency can be improved without increasing the size of the semiconductor memory device.

Figure 10:
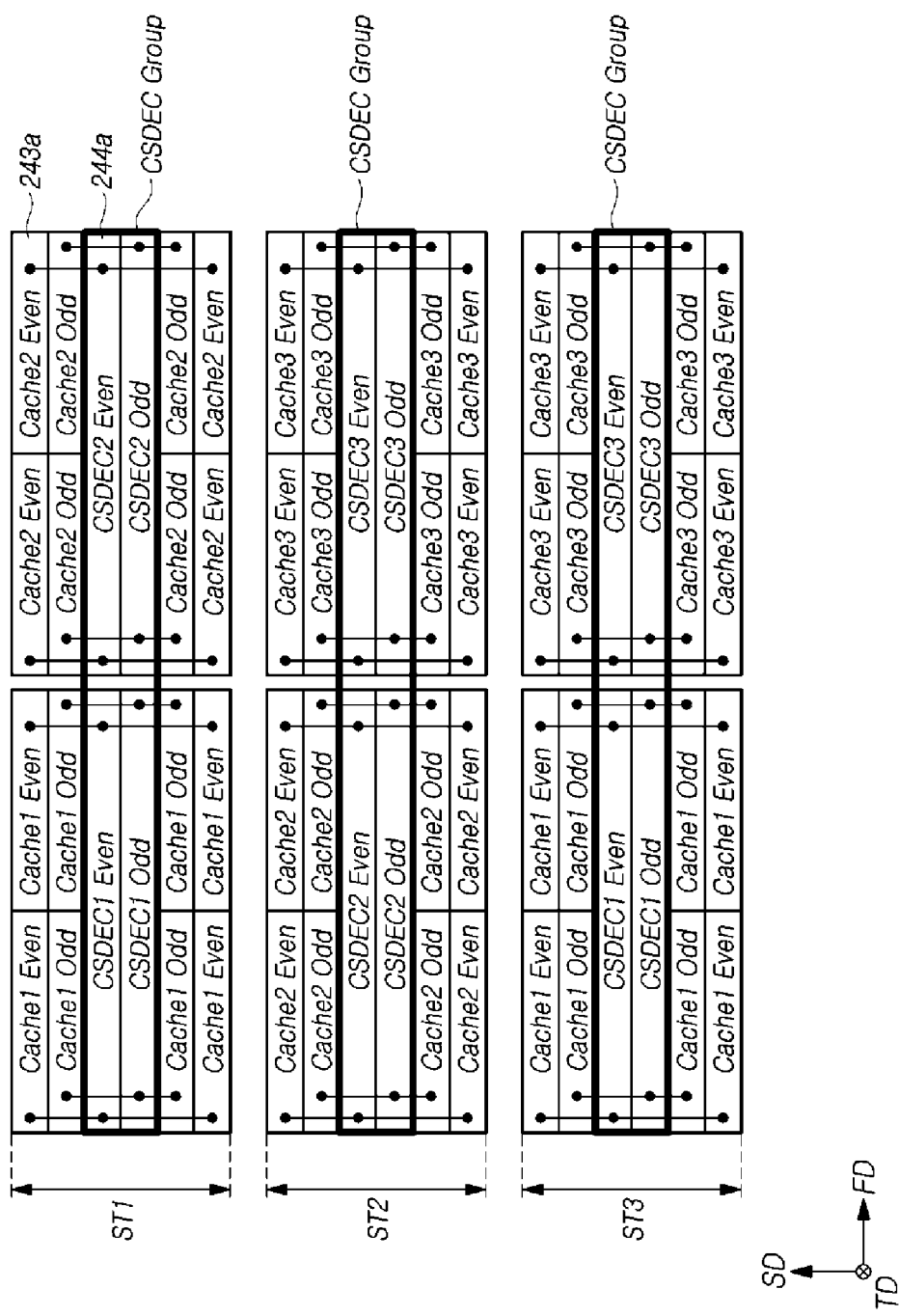
FIG. 10 is a diagram illustrating a layout of column decoders in a semiconductor memory device in accordance with an embodiment of the disclosure.

FIG. 10 is a diagram illustrating a layout of column decoders in a semiconductor memory device in accordance with an embodiment of the disclosure.

Referring to FIG. 10, a plurality of column decoders 244a are arranged in each of the sections ST1 to ST3. The column decoders 244a may be coupled to the cache latches 243a arranged in the same section as the column decoders 244a.

FIG. 10 illustrates cache latches 243a coupled to column decoders 244a of an IO cache latch unit. Under the supposition that the column decoder 244a coupled to even cache latches Cache # Even is represented by 'CSDEC # Even', and the column decoder 244a coupled to odd cache latches Cache # Odd is represented by 'CSDEC # Odd', the column decoders 244a having the same number # and the same symbol Even or Odd following the number # are coupled to the same IO cache latch unit. The column decoders 244a in which any one of the number # and the symbol Even or Odd following the number # is different are coupled to different IO cache latch unit.

In order to simplify the structure of wiring lines for coupling the column decoders 244a and the cache latches 243a, the column decoders 244a and the cache latches 243a which are coupled to each other may be arranged in a line or a column in the second direction SD.

In each of the sections ST1 to ST3, four even caches and four odd caches which are included in one cache latch unit may be arranged in 2×2 array units. The four even caches included in one cache latch unit may share one column decoder, and the four odd caches included in one cache latch unit may share one column decoder. Thus, the number of the column decoders 244a may be reduced to one-fourth (¼) of the number of the cache latches 243a. For example, in each of the sections ST1 to ST3, the column decoders 244a may be arranged in two rows which are half the number of the rows in which the cache latches 243a are arranged.

Figure 11:
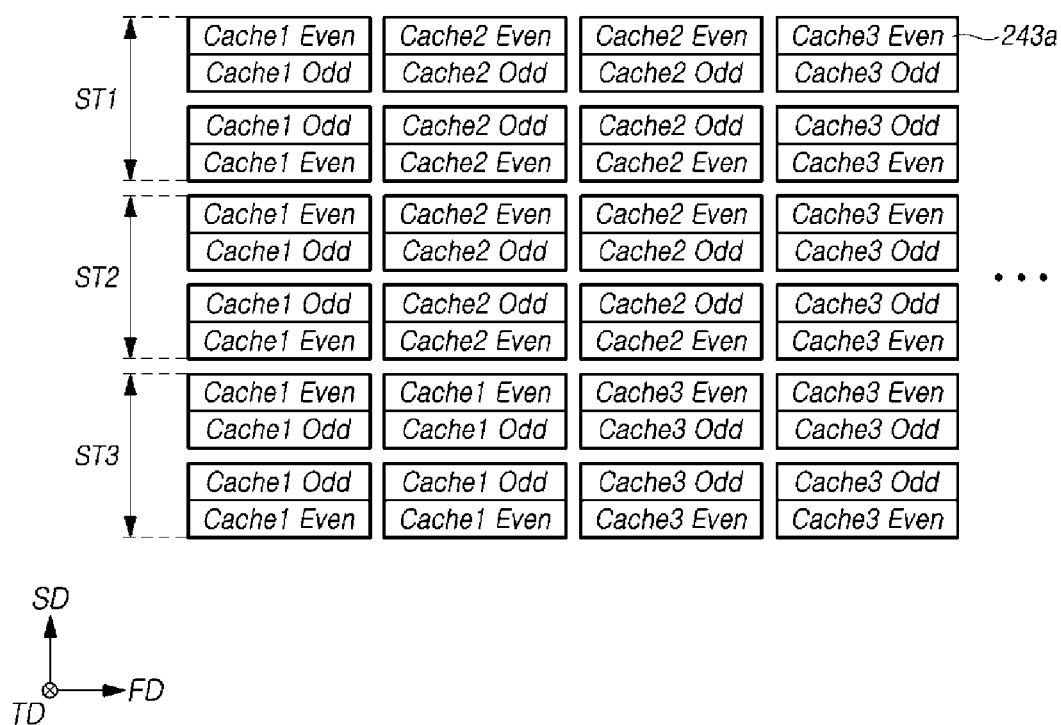
FIG. 11 is a diagram illustrating IO path allocation and column selection coding of cache latches in a semiconductor memory device related to an embodiment of the disclosure.

FIG. 11 is a diagram illustrating IO path allocation and column selection coding of cache latches in a semiconductor memory device related to an embodiment of the disclosure.

Referring to FIG. 11, IO paths may be allocated to the cache latches 243a in ascending order in the column direction. For example, the cache latches 243a arranged in a pair of consecutive columns may be included in different cache latch units. For example, the cache latches 243a arranged in the third columns of the first and second sections ST1 and ST2 may be included in a second cache latch unit (the number # of 'Cache # even' and 'Cache # Odd' is 2), while the cache latches 243a arranged in the fourth columns of the first and second sections ST1 and ST2 may be included in a third cache latch unit (the number # of 'Cache # even' and 'Cache # Odd' is 3).

Figure 12:
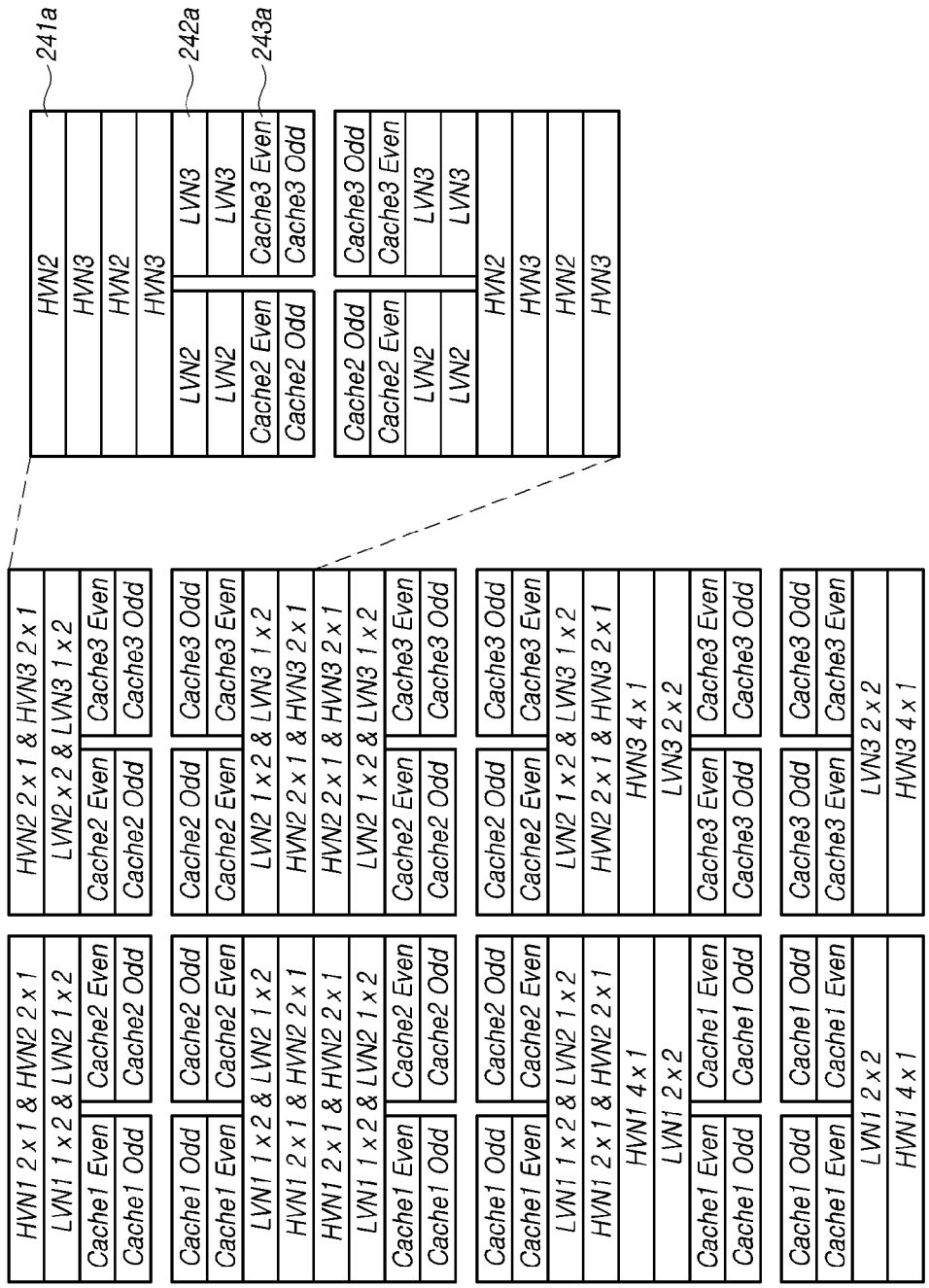
FIG. 12 is a diagram for describing column selection coding of bit line select transistors and sensing latches according to a layout of a cache latch unit in FIG. 11 according to an embodiment of the present disclosure.

FIG. 12 is a diagram for describing column selection coding of bit line select transistors and sensing latches according to a layout of the cache latch units in FIG. 11.

Referring to FIG. 12, the cache latches 243a arranged in a pair of consecutive columns may be included in different cache latch units. For example, sensing latches 242a included in one sensing latch unit, i.e. the sensing latches 242a having the same number # for 'LVN #', may be arranged in 1×2 array units, and the bit line select transistors 241a included in one bit line selection unit, i.e. the bit line select transistors 241a having the same number # for 'HVN #', may be arranged in 2×1 array units.

Figure 13:
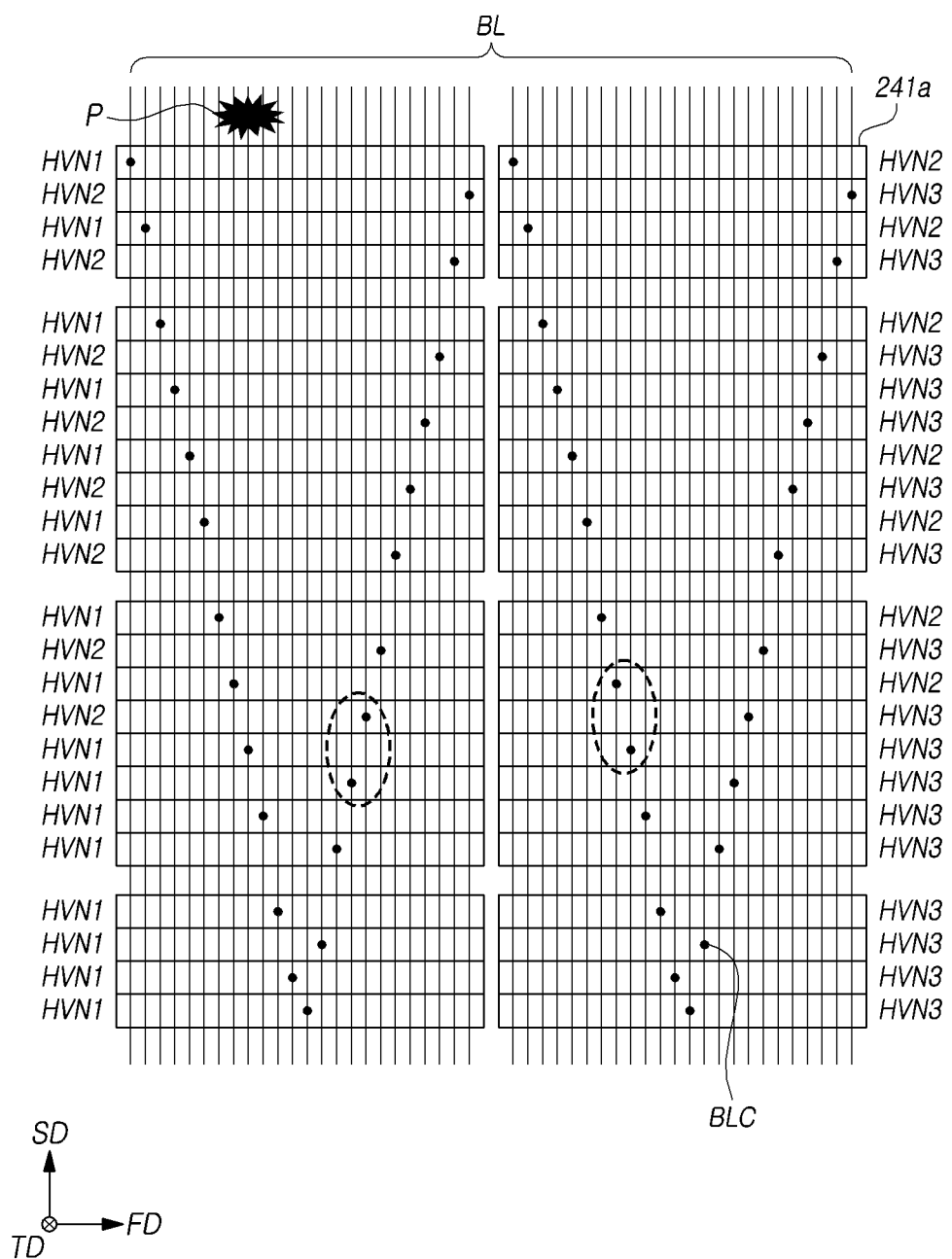
FIG. 13 is a diagram illustrating an example of a layout of bit line contacts coupled to bit line select transistors of FIG. 12 according to an embodiment of the disclosure.

FIG. 13 is a diagram illustrating an example of a layout of bit line contacts coupled to bit line select transistors of FIG. 12.

Referring to FIG. 13, the bit line contacts BLC may be arranged in such a manner that bit lines coupled to 16 bit line select transistors 241a included in one bit line selection unit are consecutively arranged. For example, the bit line contacts BLC coupled to the bit line select transistors 241a located in odd rows may be arranged at positions moving away in the first and second directions as the positions of the bit line select transistors 241a are moved downward in the second direction SD. Furthermore, the bit line contacts BLC coupled to the bit line select transistors 241a located in even rows may be arranged at positions moving away in the first and second directions as the positions of the bit line select transistors 241a are moved upward in the second direction SD. In this example, the bit line contacts BLC may form a V-shaped layout.

In the V-shaped layout of the bit line contacts BLC, the bit lines coupled to the 16 bit line selection circuits 241 included in one bit line selection unit can be consecutively arranged in the first direction, which makes it possible to improve the efficiency of the column repair for repairing a column defect caused by a defective particle P. According to the V-shaped layout, however, the distance between the bit line contacts BLC coupled to two different bit line selection units, i.e. the bit line contacts BLC coupled to bit lines corresponding to two different cache latch units, may be reduced. In FIG. 13, a portion represented by a dashed-line ellipse indicates that two bit line contacts BLC coupled to two bit lines corresponding to two different cache latch units are arranged close to each other. In this case, the two bit line contacts BLC are highly likely to be shorted to each other. This indicates that both of the two cache latch units are highly likely to be processed as defective cache latch units. Thus, the column repair efficiency may be lowered. Although increasing the space between the bit lines corresponding to two cache latch units, and the space between the bit line contacts BLC may improve column repair efficiency, the layout area would also be increased.

In accordance with an embodiment described above with reference to FIG. 9, the space between the bit line contacts BLC coupled to the bit lines corresponding to different cache latch units can be secured without an increase in the layout area. Thus, the column repair efficiency can be improved without an increase in size of the semiconductor memory device.

Figure 14:
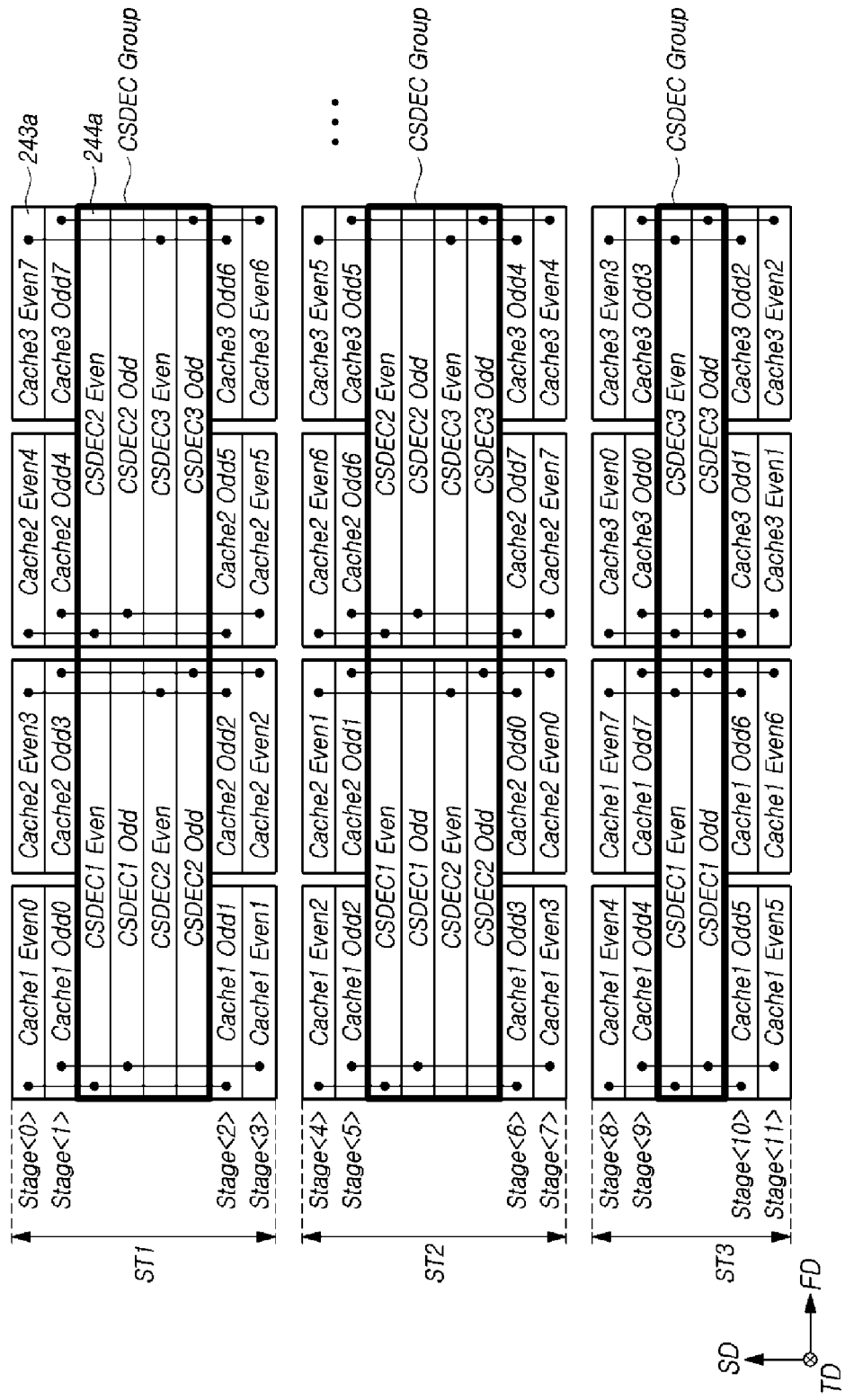
FIG. 14 is a diagram for describing a layout of column decoders of a semiconductor memory device related to an embodiment of the disclosure.

FIG. 14 is a diagram for describing a layout of column decoders of a semiconductor memory device related to an embodiment of the present disclosure.

Referring to FIG. 14, the cache latches 243a arranged in a pair of consecutive columns may be included in different cache latch units. In this example, every two even caches and two odd caches, out of four even caches and four odd caches which are arranged in a pair of columns in one section of the sections ST1 to ST3, need to be coupled to different column decoders. Therefore, the number of the column decoders 244a may be reduced to half the number of the cache latches 243a, and the column decoders 244a in each of the sections ST1 to ST3 need to be arranged in four rows equal to the number of rows in which the cache latches 243a are arranged.

In accordance with the embodiment described above with reference to FIG. 10, the number of the required column decoders 244a, the number of rows in which the column decoders 244a are arranged, and the number of wiring lines for coupling the column decoders 244a and the cache latches 243a can be reduced to half those of the example described with reference to FIG. 14. Therefore, it is possible to provide a semiconductor memory device whose size is reduced by decreasing the area occupied by the column decoders 244a and the wiring lines.

Figure 15:
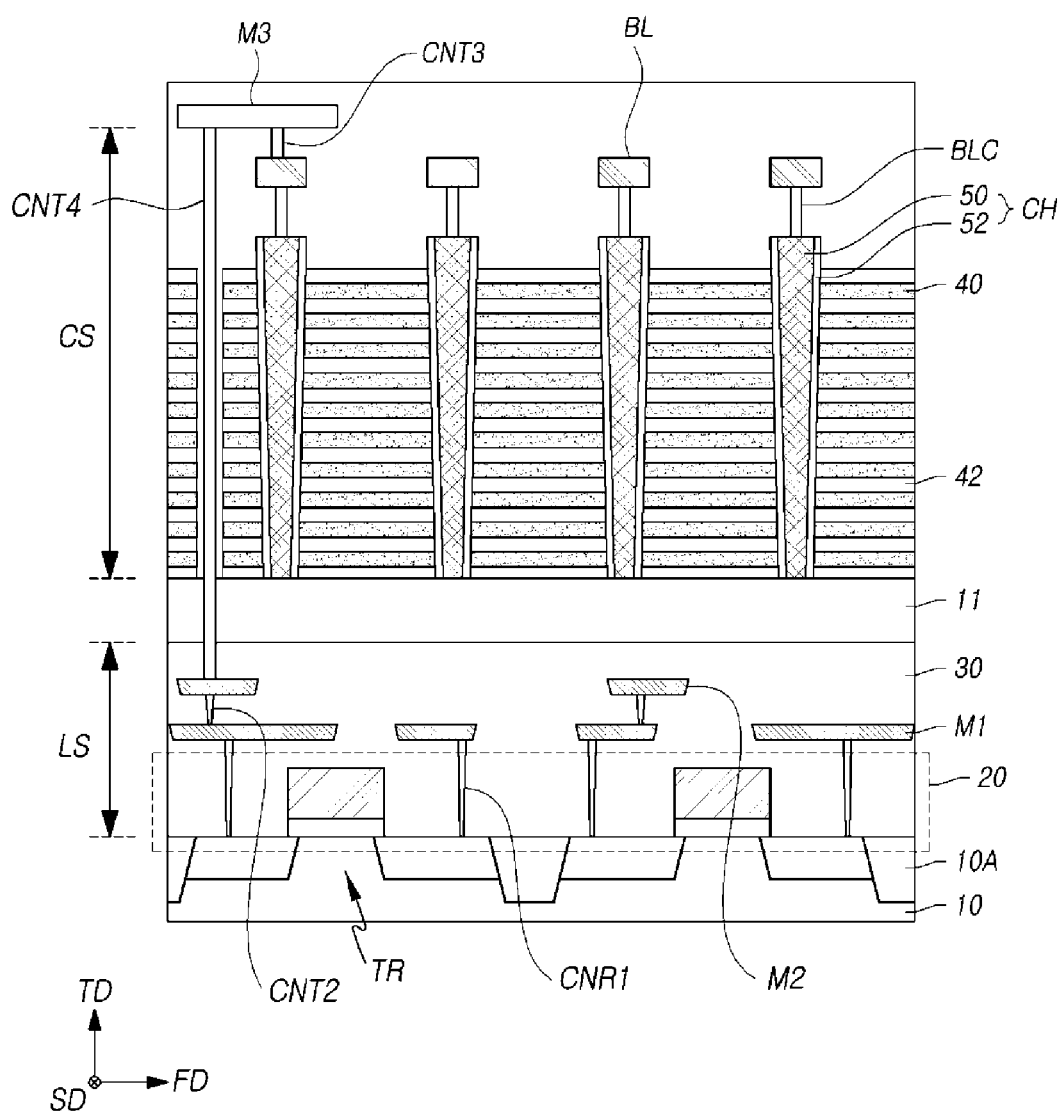
FIGS. 15 and 16 are cross-sectional views illustrating a portion of a semiconductor memory device in accordance with an embodiment of the disclosure.

FIG. 15 is a cross-sectional view illustrating a portion of a semiconductor memory device in accordance with an embodiment of the disclosure.

Referring to FIG. 15, the semiconductor memory device may have a PUC (Peri Under Cell) structure. The semiconductor memory device may include a logic structure LS disposed under a memory structure CS.

The logic structure LS may be disposed on a substrate 10. The memory structure CS may be disposed on a source plate 11, and the substrate 10 may include one or more selected from the group including a single crystal silicon layer, an SOI (Silicon On Insulator), a silicon layer formed on a silicon germanium (SiGe) layer, a single crystal silicon layer formed on a dielectric layer, and a polysilicon layer formed on a dielectric layer. The source plate 11 may be formed of a polysilicon layer. Unlike the substrate 10, which may be formed of a single crystal silicon layer, the source plate 11 may be formed of a polysilicon layer because the source plate 11 needs to be formed on the logic structure LS.

The logic structure LS may include a logic circuit 20, wiring lines M1 and M2 and a dielectric layer 30.

The logic circuit 20 may include transistors TR disposed in an active region of the substrate 10, the active region being defined by an isolation layer 10A. Although not illustrated, the logic circuit 20 may further include a capacitor, an inductor and the like. The logic circuit 20 may include the PB circuit 240 of FIG. 1 in accordance with the above-described embodiments.

The dielectric layer 30 may be provided on the substrate 10 so as to cover the logic circuit 20. The dielectric layer 30 may include silicon oxide, for example, HDP (High Density Plasma) oxide or TEOS (Tetra-Ethyl-Ortho-Silicate) oxide. The dielectric layer 30 may include the plurality of wiring lines M1 and M2 provided therein. The wiring lines M1 and M2 may include first wiring lines M1 provided in a first wiring layer over the logic circuit 20, and second wiring lines M2 provided in a second wiring layer over the first wiring layer. The first wiring lines M1 may be coupled to the logic circuit 20 through first contacts CNT1. The second wiring lines M2 may be coupled to the first wiring lines M1 through second contacts CNT2.

The memory structure CS may include vertical channels CH disposed over the source plate 11, and a plurality of electrode layers 40 and a plurality of interlayer dielectric layers 42 which are alternately stacked along the vertical channels CH.

Among the electrode layers 40, the lowermost layer may constitute a source select line, and the uppermost layer may constitute a drain select line. The electrode layers 40 between the source select line and the drain select line may constitute word lines. The electrode layers 40 may include a conductive material. For example, the electrode layers 40 may include one or more selected from a doped semiconductor (ex, doped silicon or the like), a metal (ex, tungsten, copper, aluminum or the like), conductive metal nitride (ex, titanium nitride, tantalum nitride or the like) or transition metal (ex, titanium, tantalum or the like). The interlayer dielectric layers 42 may include silicon oxide.

The vertical channels CH may be connected to the source plate 11 through the electrode layers 40 and the interlayer dielectric layers 42. Each of the vertical channels CH may include a channel layer 50 and a gate dielectric layer 52. The channel layer 50 may include polysilicon or single crystal silicon, and include P-type impurities such as boron (B) in some regions thereof. The gate dielectric layer 52 may include a tunnel dielectric layer, a charge storage layer and a blocking layer which are sequentially stacked in an inward direction from the outer wall of the channel layer 50. The tunnel dielectric layer may include silicon oxide, hafnium oxide, aluminum oxide, zirconium oxide, tantalum oxide and the like. The charge storage layer may include silicon nitride, boron nitride, silicon boron nitride or polysilicon doped with impurities. The blocking layer may include a single layer of silicon oxide, silicon nitride, hafnium oxide, aluminum oxide, zirconium oxide or tantalum oxide or a stacked layer thereof. In some embodiments, the gate dielectric layer 52 may have an ONO (Oxide-Nitride-Oxide) stack structure in which oxide, nitride and oxide are sequentially stacked. In portions where the electrode layers 40 surround the vertical channels CH, source select transistors, memory cells and drain select transistors may be formed.

The bit lines BL may be coupled to the channel layers 50 of the vertical channels CH through the bit line contacts BLC. Wiring lines M3 connected to the bit lines BL through contacts CNT3 may be arranged over the bit lines BL. The wiring line M3 may be coupled to the wiring line M2 of the logic structure LS through a contact CNT4. In this way, an electrical path may be constructed, which connects the bit lines BL and the PB circuit of the logic structure LS.

Figure 16:
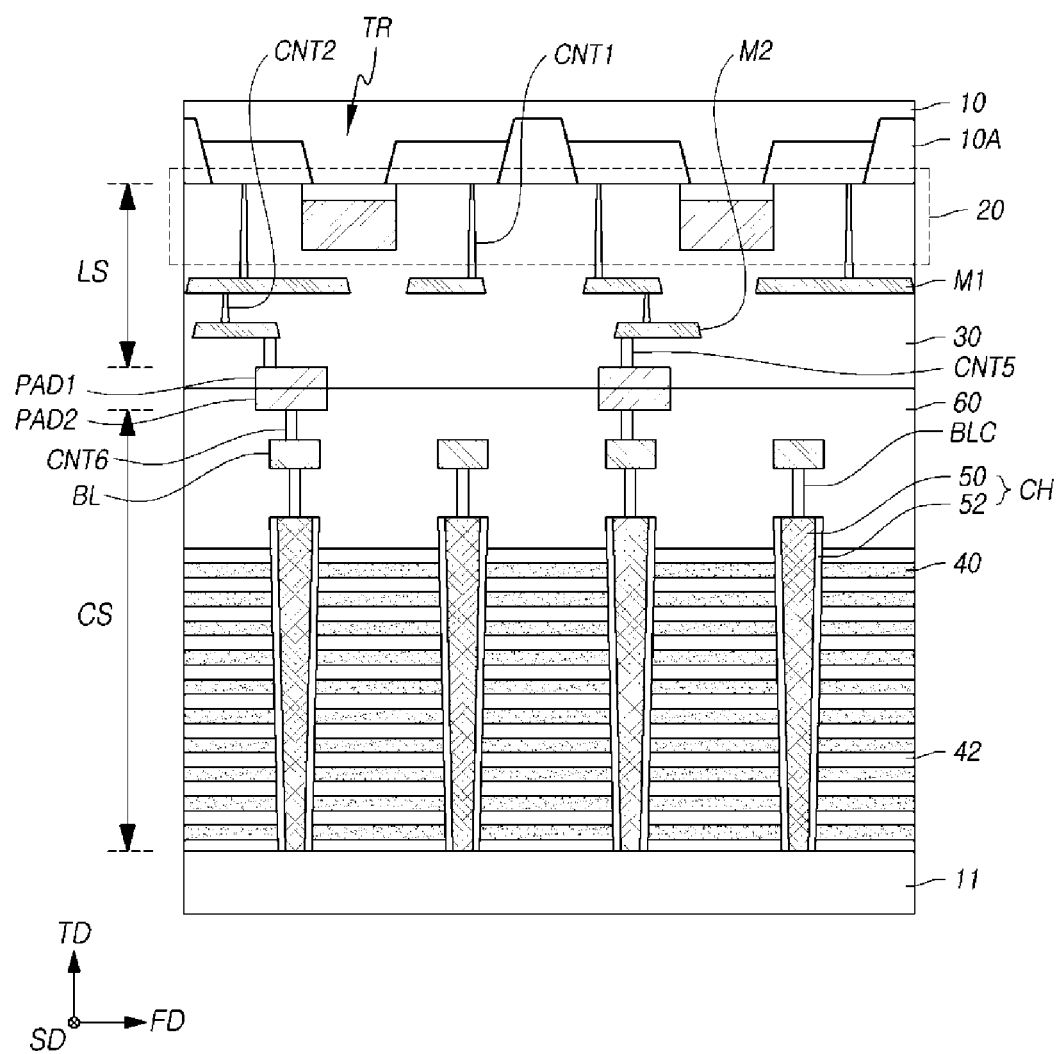

FIG. 16 is a cross-sectional view illustrating a semiconductor memory device in accordance with an embodiment of the disclosure.

Referring to FIG. 16, the semiconductor memory device may have a POC (Peri Over Cell) structure. That is, the semiconductor memory device may include the logic structure LS disposed over the memory structure CS.

The memory structure CS and the logic structure LS may be separately fabricated and then bonded to each other. The memory structure CS may be fabricated on the source plate 11. The logic structure LS may be fabricated on the substrate 10. The substrate 10 and the source plate 11 may be formed of the same material. The substrate 10 and the source plate 11 may include one or more selected from the group including a single crystal silicon layer, an SOI (Silicon On Insulator), a silicon layer formed on a silicon germanium (SiGe) layer, a single crystal silicon layer formed on a dielectric layer, and a polysilicon layer formed on a dielectric layer.

The logic structure LS may have first pads PAD1 provided on the one surface thereof. The memory structure CS may have second pads PAD2 provided on the one surface thereof. Each of the first pads PAD1 may be coupled to the logic circuit 20 through a contact CNT5, the second wiring line M2, the contact CNT2, the first wiring line M1 and the contact CNT1. Some of the second pads PAD2 may be coupled to the bit lines BL through the contacts CNT5. Although not illustrated, other second pads PAD2 may be connected to the electrode layers 40. The top surface of the logic structure LS and the top surface of the memory structure CS may be bonded to each other such that the first pads PAD1 of the logic structure LS are coupled to the second pads PAD2 of the memory structure CS. In this way, an electrical path may be constructed, which couples the memory cells of the memory structure CS to the logic circuit 20 of the logic structure LS.

Figure 17:
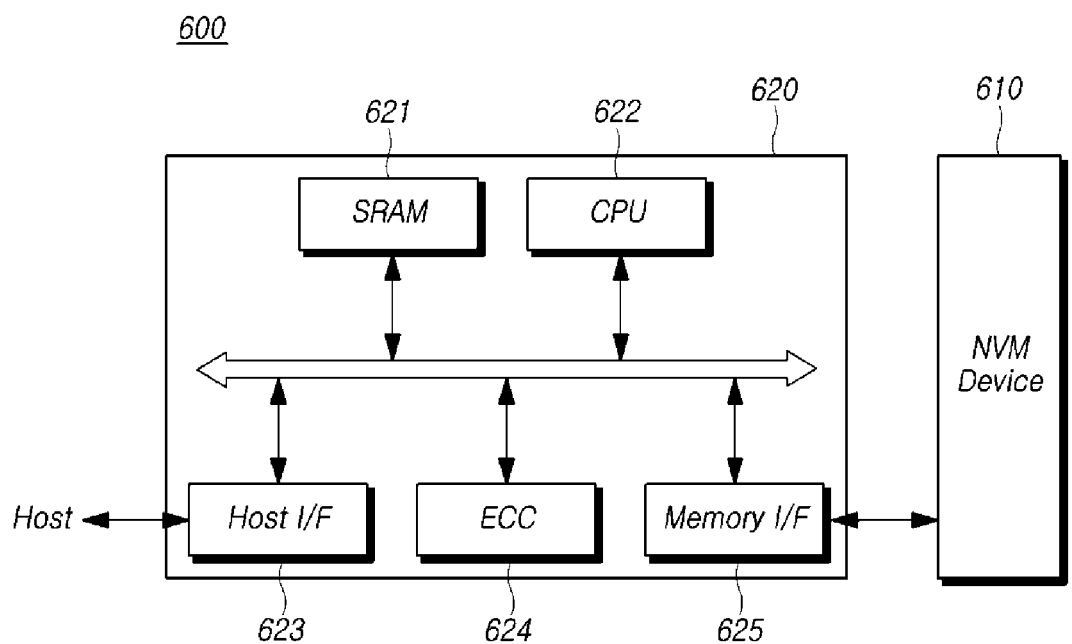
FIG. 17 is a block diagram schematically illustrating a memory system including a semiconductor memory device in accordance with an embodiment of the disclosure.

FIG. 17 is a block diagram schematically illustrating an example of a memory system including a semiconductor memory device in accordance with an embodiment of the disclosure.

Referring to FIG. 17, a memory system 600 in accordance with an embodiment of the disclosure may include a nonvolatile memory device 610 and a memory controller 620.

The nonvolatile memory device 610 may be constituted by a semiconductor memory device described above and may operate in the manner described above. The memory controller 620 may be configured to control the nonvolatile memory device 610. The combination of the nonvolatile memory device 610 and the memory controller 620 may be configured as a memory card or a solid state disk (SSD). An SRAM 621 is used as a working memory of a processing unit 622. A host interface 623 includes a data exchange protocol of a host which is coupled with the memory system 600.

An error correction code block 624 detects and corrects an error included in data read from the nonvolatile memory device 610.

A memory interface 625 interfaces with the nonvolatile memory device 610 of the present embodiment. The processing unit 622 performs general control operations for data exchange of the memory controller 620.

Although not shown in the drawing, it is obvious to a person skilled in the art to which the embodiment pertains that the memory system 600 in accordance with the embodiment may be additionally provided with a ROM which stores code data for interfacing with the host. The nonvolatile memory device 610 may be provided as a multi-chip package which is constituted by a plurality of flash memory chips.

The memory system 600 in accordance with the embodiment, described above, may be provided as a storage medium of high reliability, which has a low probability of an error to occur. In particular, the nonvolatile memory device of the present embodiment may be included in a memory system such as a solid state disk (SSD) which is being actively studied recently. In this case, the memory controller 620 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 18:
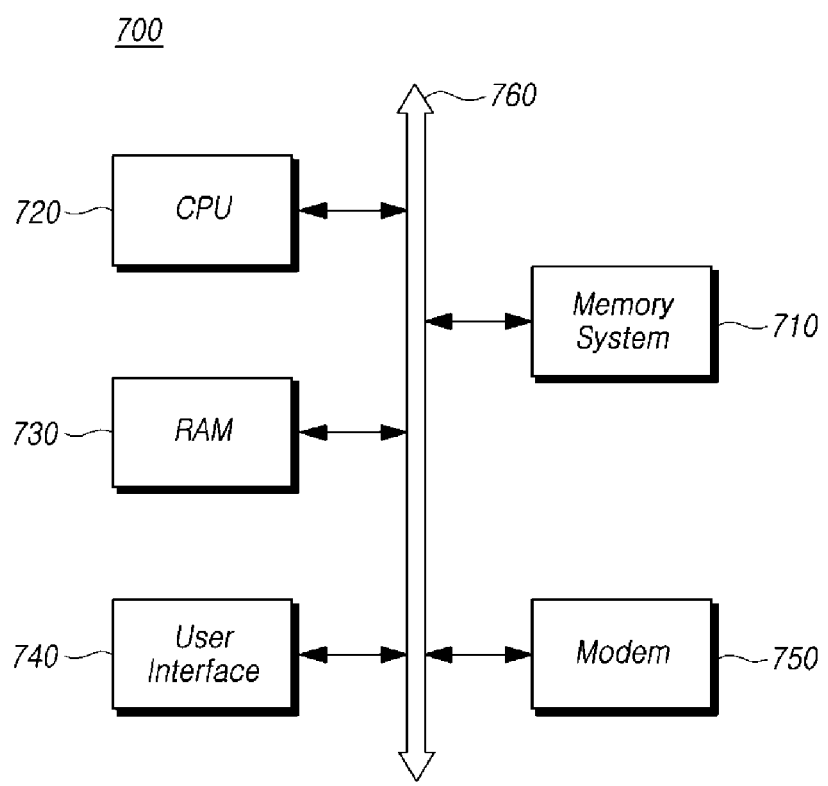
FIG. 18 is a block diagram schematically illustrating a computing system including a semiconductor memory device in accordance with an embodiment of the disclosure.

FIG. 18 is a block diagram schematically illustrating an example of a computing system including a semiconductor memory device in accordance with an embodiment of the disclosure.

Referring to FIG. 18, a computing system 700 in accordance with an embodiment of the disclosure may include a memory system 710, a microprocessor 720, a RAM 730, a user interface 740 and a modem 750 such as a base band chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a One NAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure may be interpreted in connection with the appended claims and encompass all equivalents falling within the scope of the appended claims.

What is claimed is:

1. A semiconductor memory device comprising:
   a memory cell array;
   a cache latch circuit configured to exchange data with the memory cell array through a plurality of bit lines extending in a second direction crossing a first direction;
   a plurality of even bit lines and a plurality of odd bit lines; and
   a plurality of input/output (IO) pins,
   wherein the cache latch circuit comprises a plurality of cache latches arranged in a plurality of columns that are arranged in the first direction and in a plurality of rows that are arranged in the second direction,
   wherein the cache latches in two adjacent columns are divided into a plurality of sections, arranged in the second direction, that are separated by a bit line select transistor and a sensing latch,
   wherein the cache latches in each section comprise a plurality of rows of even cache latches coupled to even bit lines and a plurality of rows of odd cache latches coupled to odd bit lines,
   wherein even cache latches in two adjacent columns or odd cache latches in two adjacent columns that are simultaneously selected to output data in parallel to the plurality of IO pins comprise one IO cache latch unit, and
   wherein the selected cache latches in the one IO cache latch unit are arranged in 2×2 array units in each of the plurality of sections.

2. The semiconductor memory device of claim 1, wherein the 2×2 array units are arranged in two different sections from among the plurality of sections.

3. The semiconductor memory device of claim 1, further comprising a plurality of column decoder groups, each of the plurality of column decoder groups dividing the plurality of rows in each of the plurality of sections and coupling the selected cache latches in the one IO cache latch unit arranged in the 2×2 array units in each of the plurality of sections, wherein each of the plurality of column decoder groups is adjacent to consecutive rows of cache latches in the section and provides a column select signal to the selected cache latches in the section.

4. A semiconductor memory device comprising:
   a memory cell array;
   a plurality of bit lines extending in a second direction crossing a first direction, and comprising a plurality of even bit lines and a plurality of odd bit lines that are alternately arranged in the first direction; and
   a cache latch circuit, configured to exchange data with the memory cell array through the plurality of bit lines, comprising a plurality of cache latches arranged in a plurality of columns in the first direction and in a plurality of rows in the second direction,
   wherein the plurality of rows are divided into a plurality of sections by a plurality of sensing latches,
   wherein the plurality of cache latches are coupled to any one of a $2^N$ IO pins (where N is a positive integer),
   wherein a $2^N$ cache latches coupled to even bit lines and simultaneously selected to output data in parallel to the $2^N$ IO pins comprise a first IO cache latch unit,
   wherein a $2^N$ cache latches coupled to odd bit lines and simultaneously selected to output data in parallel to the $2^N$ IO pins comprise a second IO cache latch unit,
   wherein a cache latch unit comprises the first IO cache latch unit and the second IO cache latch unit, and
   wherein the cache latches included in each of the first and second IO cache latch units in adjacent columns within a respective section are arranged in 2×2 array units.

5. The semiconductor memory device of claim 4, wherein the plurality of even bit lines coupled to the cache latches of the first IO cache latch unit and the plurality of odd bit lines coupled to the cache latches of the second IO cache latch unit are alternately arranged and are adjacent to each other.

6. The semiconductor memory device of claim 4, wherein the number of rows in which the cache latches comprising the one cache latch unit are arranged is smaller than the number of rows in which all cache latches comprising the cache latch circuit are arranged.

7. The semiconductor memory device of claim 4, wherein when at least one of the cache latches included in the one cache latch unit is a defective cache latch, and wherein all cache latches included in the one cache latch unit are repaired at the same time.

8. The semiconductor memory device of claim 4, wherein the cache latches included in the one cache latch unit in each of the plurality of sections are arranged, in adjacent columns, into 4×2 array units.

9. The semiconductor memory device of claim 8, further comprising a plurality of bit line select transistors,
wherein the plurality of sensing latches are directly coupled to the cache latches and the plurality of bit line select transistors are coupled to the cache latches through the plurality of sensing latches,
wherein the plurality of sensing latches coupled to the cache latches comprising a 4×2 array unit are separated into two 2×2 arrays that are arranged in the second direction on both sides of the cache latches comprising the 4×2 array unit, and
wherein the plurality of bit line select transistors that are coupled to the cache latches comprising the 4×2 array unit are separated into two 4×1 arrays, which are arranged in the second direction on both sides of the cache latches comprising the 4×2 array unit.

10. The semiconductor memory device of claim 4, further comprising a plurality of column decoder groups, each of the plurality of column decoder groups dividing the plurality of rows in each of the plurality of sections, wherein each of the plurality of column decoder groups is adjacent to consecutive rows of cache latches in the section and provides a column select signal directly to the selected cache latches in the section.

11. The semiconductor memory device of claim 10, wherein the plurality of bit lines are coupled to the plurality of bit line select transistors respectively through a plurality of bit line contacts,
wherein, from among the plurality of bit line select transistors, bit line select transistors coupled to the cache latch unit comprise one bit line selection unit,
wherein the plurality of bit line contacts are consecutively arranged in the first direction and in the second direction to couple the plurality of bit lines to the bit line select transistors included in the one bit line selection unit.

12. The semiconductor memory device of claim 10, wherein the plurality of bit lines are coupled to the plurality of respective bit line select transistors through the plurality of bit line contacts,
wherein, from among the plurality of bit line select transistors, bit line select transistors coupled to the cache latch unit comprise one bit line selection unit,
wherein the plurality of bit line contacts are arranged so that the plurality of bit lines coupled to the plurality of bit line select transistors included in the one bit line selection unit are not adjacent to the plurality of bit lines coupled to the plurality of bit line select transistors included in another bit line selection unit.

13. A semiconductor memory device comprising:
a plurality of cache latches arranged in a plurality of sections arranged in a second direction crossing a first direction, and configured to form a plurality of columns and a plurality of rows arranged in the first and second directions, respectively;
a plurality of sensing latches coupled respectively to the plurality of cache latches, and arranged in the second direction in a plurality of regions located on both sides of each of the plurality of sections; and
a plurality of bit line select transistors arranged in the plurality of regions and coupled between the plurality of sensing latches and a plurality of bit lines extending in the second direction,
wherein each of the cache latches is coupled to any one of a plurality of IO pins,
wherein cache latches simultaneously selected to output data in parallel to the plurality of IO pins comprise an IO cache latch unit, and
wherein the cache latches included in the IO cache latch unit in adjacent columns within a respective section comprise a 2×2 array.

14. The semiconductor memory device of claim 13, wherein a plurality of the 2×2 arrays are arranged in different sections from among the plurality of sections.

15. The semiconductor memory device of claim 13, further comprising a plurality of column decoders, each of the plurality of column decoders separating the plurality of rows in each of the plurality of sections and coupling in common the selected cache latches in the one IO cache latch unit comprising the 2×2 arrays to provide a column select signal to the selected cache latches,
wherein each of the plurality of column decoders is disposed adjacent to consecutive rows of cache latches in the same section as the selected cache latches comprising the 2×2 array.

16. The semiconductor memory device of claim 13, wherein the plurality of bit lines comprises a plurality of even bit lines and a plurality of odd bit lines, which are alternately arranged in the first direction,
wherein the selected cache latches that are coupled simultaneously to the even bit lines and to the IO pins comprise a first IO cache latch unit, and the cache latches which that are simultaneously coupled to the odd bit lines and to the IO pins comprise a second IO cache latch unit,
wherein one cache latch unit comprises the first IO cache latch unit and the second IO cache latch unit, and the even bit lines coupled to the cache latches of the first IO cache latch unit and the odd bit lines coupled to the cache latches of the second IO cache latch unit are alternately arranged while being adjacent to each other.

17. The semiconductor memory device of claim 16, wherein the number of rows of cache latches included in the one cache latch unit is smaller than the number of rows in which the plurality of cache latches comprising the cache latch circuit are arranged.

18. The semiconductor memory device of claim 16, wherein the cache latches included in the one cache latch unit in each of the plurality of sections are arranged, in adjacent columns, into a plurality of 4×2 arrays.

19. The semiconductor memory device of claim 18, wherein the plurality of sensing latches coupled to the cache latches comprising a 4×2 array are separated into two 2×2 arrays, and the two 2×2 arrays are arranged in opposite side regions, in the second direction, of the cache latches comprising the 4×2 array.

20. The semiconductor memory device of claim 18, wherein the plurality of bit line select transistors coupled to the cache latches comprising the 4×2 array are separated into two 4×1 arrays, and arranged in opposite side regions, in the second direction, of the cache latches comprising the 4×2 array.

* * * * *